US011075497B2

(12) United States Patent
Hagita et al.

(10) Patent No.: US 11,075,497 B2
(45) Date of Patent: Jul. 27, 2021

(54) LASER DEVICE AND INTERNAL COMBUSTION ENGINE

(71) Applicants: Kentaroh Hagita, Miyagi (JP); Yoichi Ishikawa, Miyagi (JP); Naoto Jikutani, Miyagi (JP); Toshiyuki Ikeoh, Miyagi (JP); Yuzuru Sasaki, Kanagawa (JP); Yusuke Okura, Kanagawa (JP)

(72) Inventors: Kentaroh Hagita, Miyagi (JP); Yoichi Ishikawa, Miyagi (JP); Naoto Jikutani, Miyagi (JP); Toshiyuki Ikeoh, Miyagi (JP); Yuzuru Sasaki, Kanagawa (JP); Yusuke Okura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 651 days.

(21) Appl. No.: 15/889,434

(22) Filed: Feb. 6, 2018

(65) Prior Publication Data

US 2018/0226764 A1 Aug. 9, 2018

(30) Foreign Application Priority Data

Feb. 6, 2017 (JP) .............................. JP2017-019616
Mar. 16, 2017 (JP) .............................. JP2017-051947
Dec. 13, 2017 (JP) .............................. JP2017-238788

(51) Int. Cl.
*F02P 23/00* (2006.01)
*F02P 23/04* (2006.01)
(Continued)

(52) U.S. Cl.
CPC .............. *H01S 3/034* (2013.01); *F02P 23/04* (2013.01); *G02B 1/118* (2013.01); *H01S 3/005* (2013.01);
(Continued)

(58) Field of Classification Search
CPC .......... H01S 3/005; H01S 3/034; H01S 3/113; H01S 3/025; H01S 3/0627; H01S 3/643;
(Continued)

(56) References Cited

U.S. PATENT DOCUMENTS

2006/0243238 A1* 11/2006 Anezaki ................ F02D 35/022
123/143 B
2016/0276809 A1 9/2016 Okura et al.
(Continued)

FOREIGN PATENT DOCUMENTS

DE 10 2012 220 143 A1 5/2013
DE 10 2013 202 165 A1 8/2013
(Continued)

OTHER PUBLICATIONS

Extended European Search Report dated Oct. 30, 2018 in corresponding European Patent Application No. 18154971.8, 10 pages.

*Primary Examiner* — Phutthiwat Wongwian
*Assistant Examiner* — Arnold Castro
(74) *Attorney, Agent, or Firm* — Oblon, McClelland, Maier & Neustadt, L.L.P.

(57) ABSTRACT

Laser devices include a light source that emits a laser beam, an optical system that concentrates the laser beam emitted from the light source, an optical window through which the laser beam exited from the optical system passes, a housing that accommodates the optical system, and an optical window holding member fixed to the housing. The optical window holding member holds the optical window. In the first laser device, the optical window has a face or a protruding face through which the laser beam passes. When the optical window has the face, the face is flush with an edge of the optical window holding member and a film is formed on the face. When the optical window has the protruding face, the protruding face protrudes with reference (Continued)

to the edge of the optical window holding member and a film is formed on the protruding face.

20 Claims, 24 Drawing Sheets

(51) Int. Cl.
| | |
|---|---|
| H01S 3/034 | (2006.01) |
| H01S 3/094 | (2006.01) |
| H01S 3/02 | (2006.01) |
| G02B 1/118 | (2015.01) |
| H01T 13/06 | (2006.01) |
| H01S 3/06 | (2006.01) |
| H01S 3/00 | (2006.01) |
| H01S 3/0941 | (2006.01) |
| H01S 3/16 | (2006.01) |
| F02P 13/00 | (2006.01) |
| H01S 3/113 | (2006.01) |
| H01S 5/42 | (2006.01) |

(52) U.S. Cl.
CPC ............ *H01S 3/025* (2013.01); *H01S 3/0627* (2013.01); *H01S 3/09415* (2013.01); *H01S 3/094053* (2013.01); *H01S 3/094057* (2013.01); *H01S 3/1685* (2013.01); *H01T 13/06* (2013.01); *F02P 13/00* (2013.01); *H01S 3/0606* (2013.01); *H01S 3/113* (2013.01); *H01S 3/1643* (2013.01); *H01S 5/423* (2013.01)

(58) Field of Classification Search
CPC ............... H01S 3/1685; H01S 3/09415; H01S 3/094053; H01S 3/094057; H01S 3/10606; H01S 5/423; G02B 1/118; H01T 13/06; F02P 23/04; F02P 13/00
See application file for complete search history.

(56) References Cited

U.S. PATENT DOCUMENTS

| | | |
|---|---|---|
| 2017/0168412 A1 | 6/2017 | Harada et al. |
| 2017/0179667 A1 | 6/2017 | Okura et al. |

FOREIGN PATENT DOCUMENTS

| | | |
|---|---|---|
| DE | 10 2016 101 266 A1 | 8/2016 |
| EP | 3 181 892 A1 | 6/2017 |
| JP | 2006-104972 | 4/2006 |
| JP | 2016-109128 A | 6/2016 |
| WO | WO2011/060983 A1 | 5/2011 |
| WO | WO 2016/093214 A1 | 6/2016 |

* cited by examiner

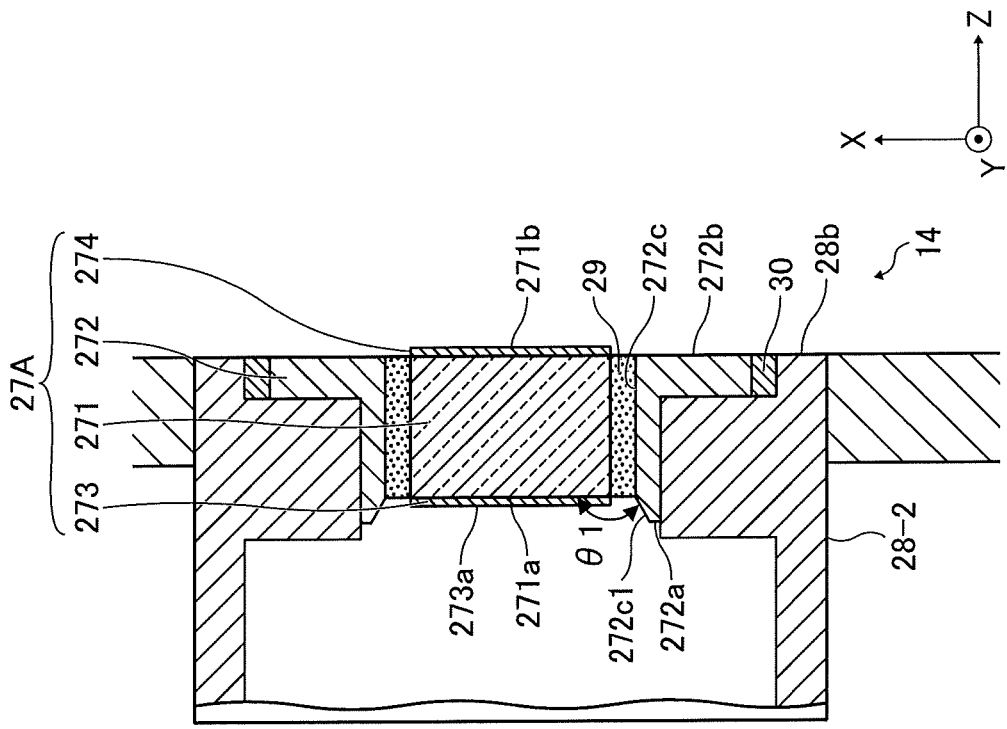
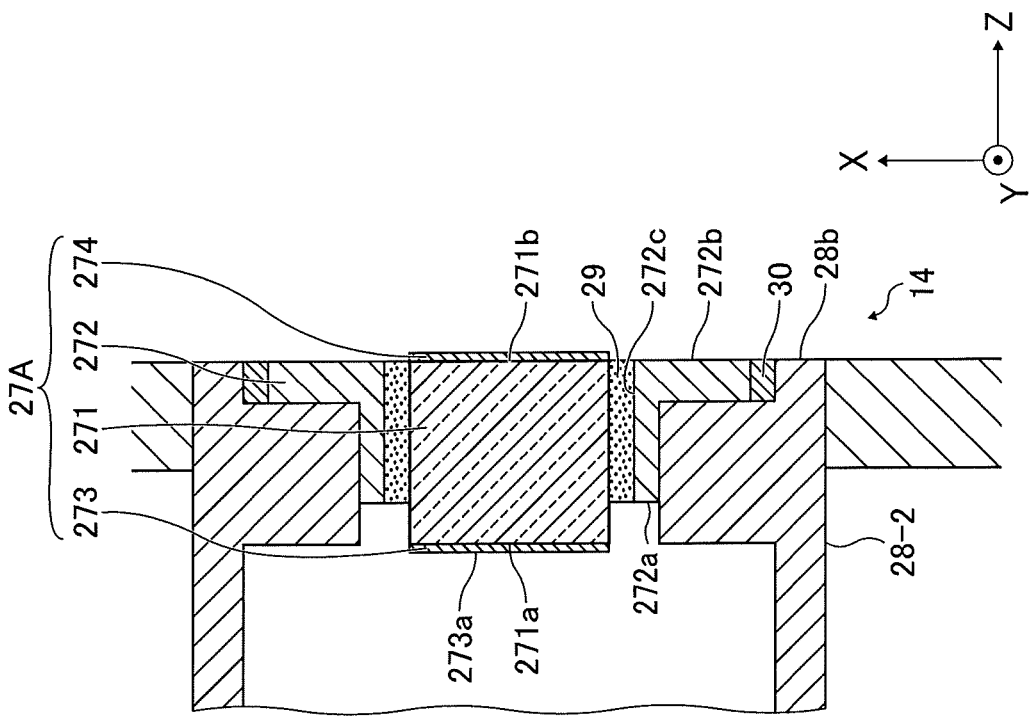

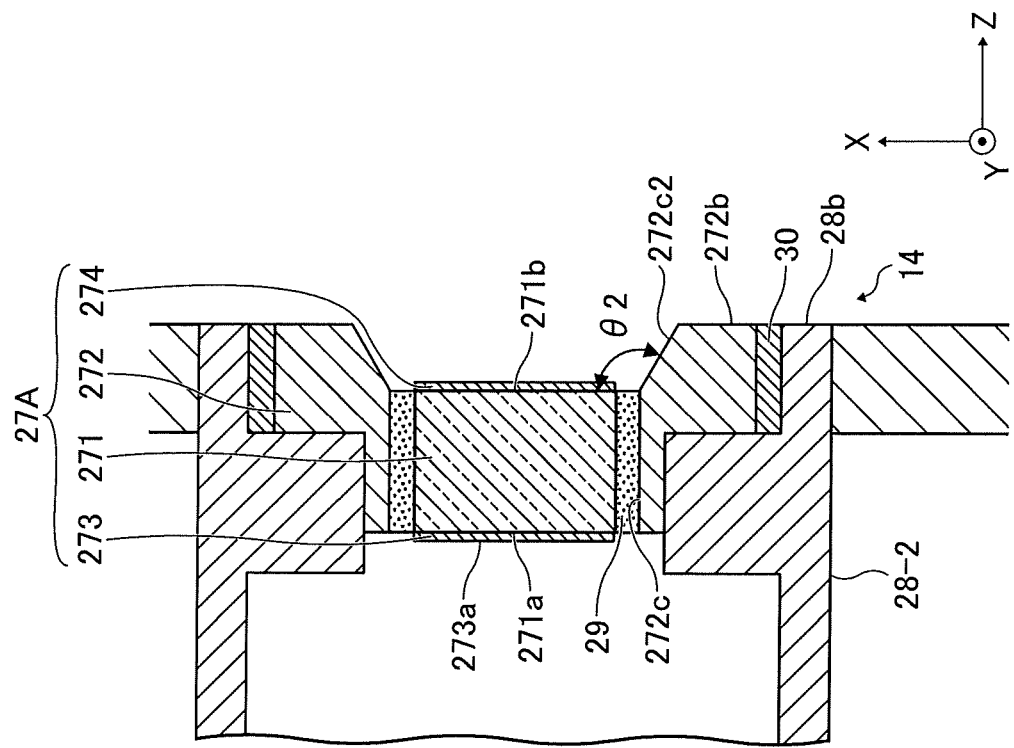
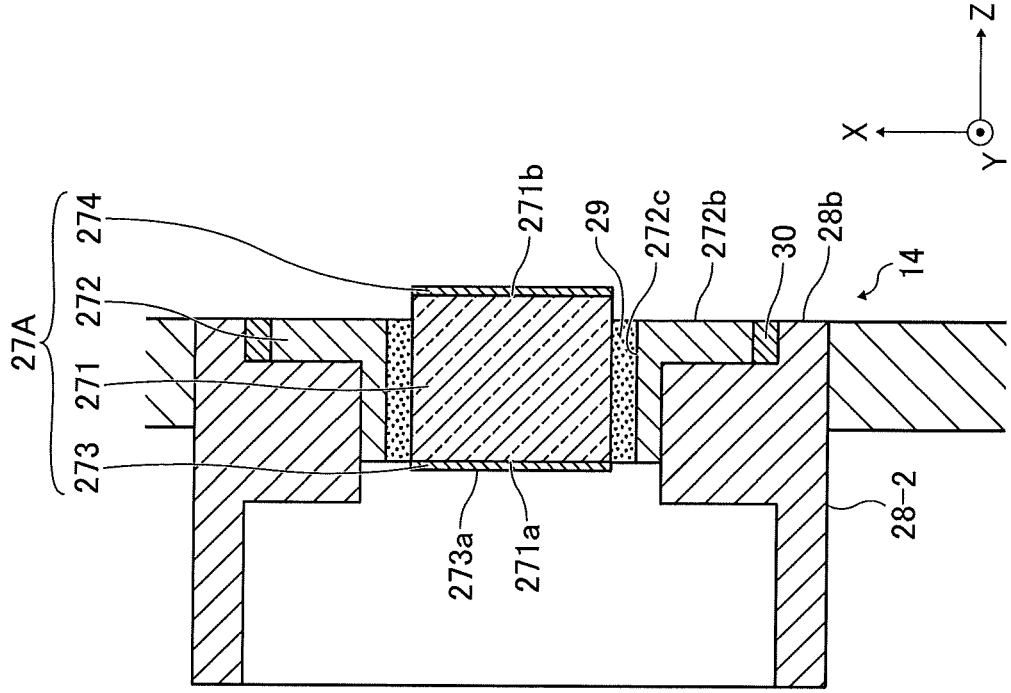
FIG. 5A
FIG. 5B

LASER DEVICE AND INTERNAL COMBUSTION ENGINE

CROSS-REFERENCE TO RELATED APPLICATIONS

This patent application is based on and claims priority pursuant to 35 U.S.C. § 119(a) to Japanese Patent Application Nos. 2017-019616, 2017-051947, and 2017-238788, filed on Feb. 6, 2017, Mar. 16, 2017, and Dec. 13, 2017, respectively, in the Japan Patent Office, the entire disclosures of which are hereby incorporated by reference herein.

BACKGROUND

Technical Field

Embodiments of the present invention relate to a laser device and an internal combustion engine.

Background Art

Laser devices that adopt a semiconductor laser as a pump source are expected to be applied to various kinds of fields including, for example, ignition systems, laser beam machines, and medical equipment. In particular, methods have been studied in which such laser devices are used as an ignition system in internal combustion engines of cars or the like.

In such an ignition system, a Q-switched laser resonator is irradiated with the laser beams (pump light) that are emitted from a semiconductor laser to emit pulsed laser beams of high energy density. The ignition system is provided with a condenser lens inside the cylinder head and a transparent window (optical window) to which light is incident, and the emitted pulsed laser beams are concentrated into the mixture of gases inside the combustion chamber through the condenser lens and the transparent window of the combustion chamber. As a result, plasma is generated inside the combustion chamber, and the fuel that is injected into the combustion chamber is ignited (see, for example, JP-2016-109128-A).

In the known ignition systems, the both edges of an optical window are clamped by a protective glass holder, and the protective glass holder is fixed to the housing. Moreover, an antireflection film is arranged on the incident plane side of the optical window to prevent the pulsed laser beams that are emitted from a laser resonator from being reflected by the incident plane of the optical window.

SUMMARY

Embodiments of the present disclosure described herein provide two types of laser devices. These laser devices include a light source that emits a laser beam, an optical system that concentrates the laser beam emitted from the light source, an optical window through which the laser beam exited from the optical system passes, a housing that accommodates the optical system, and an optical window holding member fixed to the housing. The optical window holding member holds the optical window. In the first laser device, the optical window has a face or a protruding face through which the laser beam passes. When the optical window has the face, the face is flush with an edge of the optical window holding member and a film is formed on the face of the optical window. When the optical window has the protruding face, the protruding face protrudes with reference to the edge of the optical window holding member and a film is formed on the protruding face of the optical window. In the second laser device, the optical window has a depressed face through which the laser beam passes and the depressed face is depressed with reference to an edge of the optical window holding member, the optical window holding member has a diameter-enlarged portion whose internal diameter is enlarged from a depressed position of the depressed face of the optical window towards an outside of the optical window holding member, and a film is formed on the depressed face that is at the depressed position.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

FIG. 4A is a sectional view of another example configuration of a window, according to an embodiment of the present disclosure.

FIG. 4B is a sectional view of another example configuration of a window, according to an embodiment of the present disclosure.

FIG. 5A is a sectional view of another example configuration of a window, according to an embodiment of the present disclosure.

FIG. 5B is a sectional view of another example configuration of a window, according to an embodiment of the present disclosure.

Figure 1:
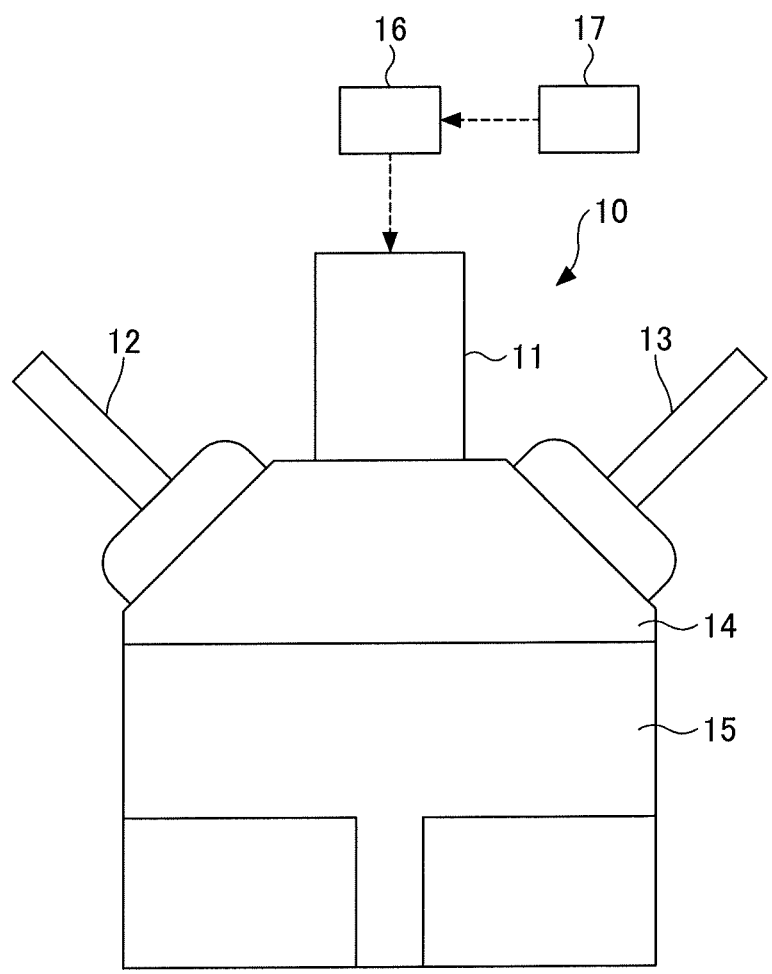
FIG. 1 is a schematic diagram of elements of an internal combustion engine for which a laser device according to a first embodiment the present disclosure is provided.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Some embodiments of the present disclosure are described below in detail with reference to the accompanying drawings.

First Embodiment

An embodiment in which a laser device according to a first embodiment of the present disclosure is used for as an internal combustion engine is described with reference to the drawings. In the present embodiment, an engine is used as the internal combustion engine.

<Internal Combustion Engine>

FIG. 1 is a schematic diagram of elements of an internal combustion engine for which a laser device according to the first embodiment the present disclosure is provided.

As illustrated in FIG. 1, an engine 10 includes, for example, a laser device 11, a fuel injector 12, an exhauster 13, a combustion chamber 14, and a piston 15.

The operation of the engine 10 is briefly described. The fuel injector 12 injects the inflammable fuel-air mixture into the combustion chamber 14 (aspiration). Then, the piston 15 moves upward, the inflammable fuel-air mixture is compressed (compression). The laser device 11 concentrates the laser beams into the compressed mixture of gases in the combustion chamber 14, in order to generate plasma. Then, the fuel in the mixture of gases is ignited by the generated plasma (ignition). As the mixture of gases burns (explodes) due to the ignition, the inflammable gas expands inside the combustion chamber 14. As a result, the piston 15 moves downward (combustion). After that, the exhauster 13 exhausts the inflammable gas to the outside of the combustion chamber 14 (exhaust).

As described above, a series of processes including aspiration, compression, ignition, combustion, and exhaust are repeated in the engine 10. Then, the piston 15 moves upward and downward according to the changes in the volume of the gas in the combustion chamber 14, and kinetic energy is produced. As fuel, for example, natural gas and gasoline are used.

Note that the laser device 11 is electrically connected to a driver 16 that is arranged outside the engine 10, and the driver 16 controls the laser beams emitted from the laser device 11 based on instructions given from an engine controller 17.

<Laser Device>

Next, the laser device 11 is described.

Figure 2:
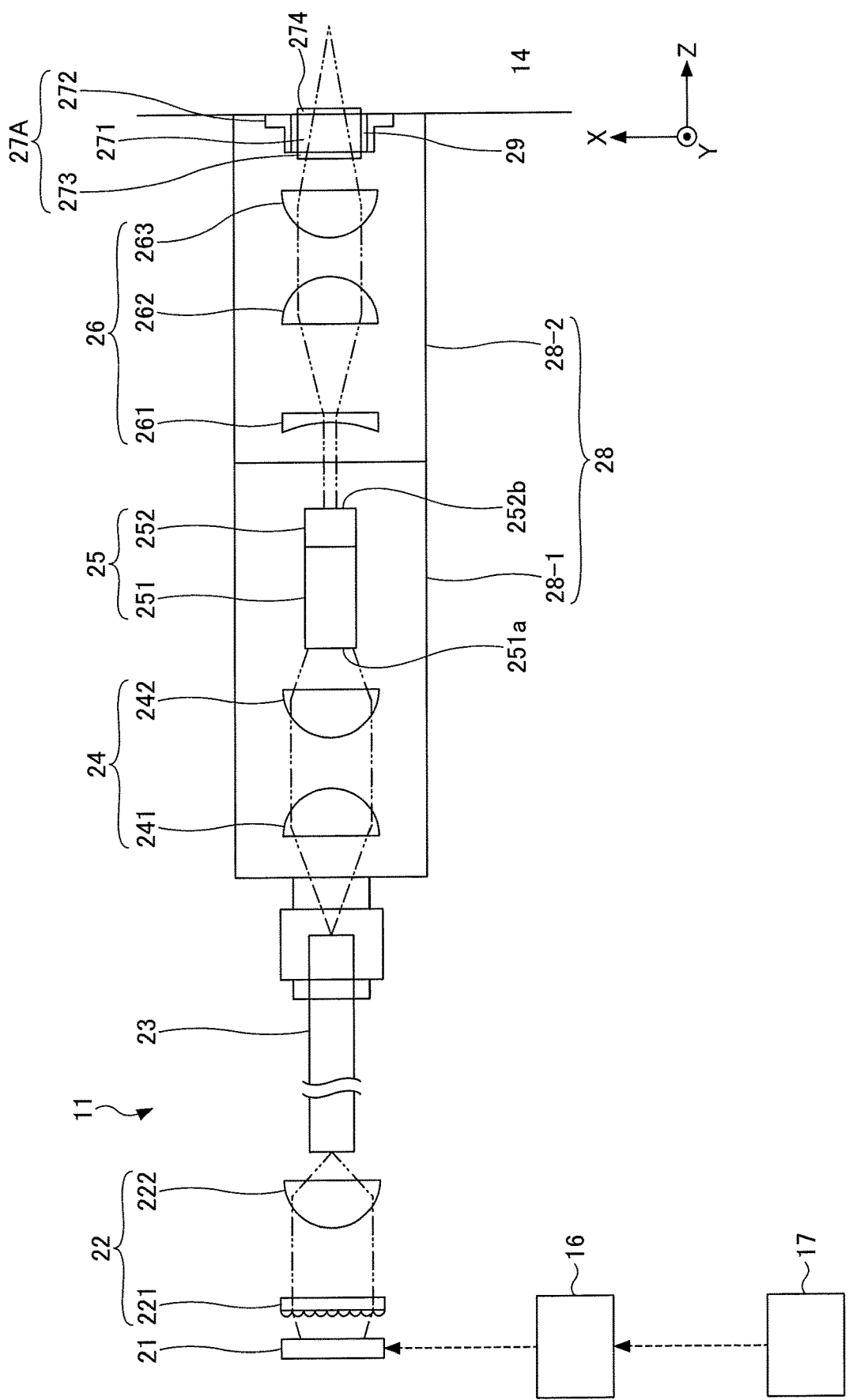
FIG. 2 is a diagram illustrating a configuration of a laser device, according to an embodiment of the present disclosure.

FIG. 2 is a diagram illustrating a configuration of the laser device 11, according to the present embodiment.

As illustrated in FIG. 2, the laser device 11 includes a surface emitting laser (light source) 21, a first condensing optical system 22, an optical fiber (transmission member) 23, a second condensing optical system 24, a laser resonator 25, a third condensing optical system 26, a window 27A, and a housing 28. In FIG. 2, the laser beams are indicated by the two-dot chain line. In the present disclosure, a three-dimensional rectangular system where the X-axis direction, Y-axis direction, and the Z-axis direction make up the triaxial directions is used. It is assumed that the direction in which the surface-emitting laser 21 emits light is in the +Z-direction, and that the two directions orthogonal to each other on a plane perpendicular to the optical axis of the laser beams are the X-axis direction and the Y-axis direction.

The surface-emitting laser 21 is a pump source, and includes a plurality of light-emitting units. Each of the light-emitting units is a vertical cavity-surface emitting laser (VCSEL). When the surface-emitting laser 21 emits laser beams, the multiple light-emitting units emit laser beams at the same time. On the other hand, when the surface-emitting laser 21 does not emit laser beams, the multiple light-emitting units are turned off at the same time. Moreover, the wavelength of the laser beams that are emitted from the surface-emitting laser 21 is, for example, about 808 nanometers (nm).

The surface-emitting laser 21 is electrically connected to the driver 16, and the driver 16 drives the surface-emitting laser 21 based on instructions given from the engine controller 17. Accordingly, the laser beams are emitted from the surface-emitting laser 21.

It is to be noted that an end-surface emitting laser is known as a semiconductor laser. However, the wavelength of the laser beams that are emitted from such an end-surface emitting laser tends to fluctuate widely depending on the temperature. The laser device 11 is used under high-temperature environments around the engine 10. For this reason, when an end-surface emitting laser is used as a pump source, a high-precision temperature control unit that maintains the temperature of the end-surface emitting laser at a constant level needs to be provided. This leads to an increase in the cost of manufacturing the laser device 11 and an increase in the size of the laser device 11.

By contrast, changes in the wavelength of the laser beams that are emitted from the surface-emitting laser 21 is about one-tenths of the changes in the wavelength of the laser beams that are emitted from the end-surface emitting laser. The laser device 11 uses the surface-emitting laser 21 as a pump source. Accordingly, a high-precision temperature control unit is not necessary. This leads to a reduction in the cost of manufacturing the laser device 11 and a reduction in the size of the laser device 11. Moreover, the light-emitting area of the surface-emitting laser 21 is arranged inside the semiconductor. Accordingly, the surface-emitting laser 21 can emit laser beams in a stable manner with no concern about the damage at the end surface.

Note also that the surface-emitting laser 21 has very little temperature-driven wavelength displacement in the emitted laser beams. For this reason, the surface-emitting laser 21 is a light source advantageous in increasing the energy density of the laser beams in a Q-switched laser resonator whose characteristics vary widely due to the wavelength displacement. Accordingly, when the surface-emitting laser 21 is used as a pump source, the temperature control of the environment becomes easier.

The first condensing optical system 22 concentrates the laser beams that are emitted from the surface-emitting laser 21 into the core diameter of the optical fiber 23 on the −Z side lateral edge face. The first condensing optical system 22 includes at least one condenser lens. In the present embodiment, the first condensing optical system 22 includes a microlens 221 and a condenser lens system 222.

The microlens 221 is disposed in the optical path of the laser beams emitted from the surface-emitting laser 21. The microlens 221 includes a plurality of lenses that correspond to the multiple light-emitting units of the surface-emitting laser 21. The lenses of the microlens 221 approximately collimates the laser beams emitted from the corresponding light-emitting units of the surface-emitting laser 21. In other words, the microlens 221 collimates the laser beams emitted from the surface-emitting laser 21.

The distance between the surface-emitting laser 21 and the microlens 221 in the Z-axis direction is determined according to the focal length of the microlens 221.

The condenser lens system 222 concentrates the laser beams that have passed through the microlens 221.

The condenser lens system 222 is appropriately selected according to the cross-sectional area of the laser beams that have passed through the microlens 221 and the core diameter and numerical aperture (NA) of the optical fiber 23. The condenser lens system 222 may include a plurality of optical elements.

The first condensing optical system 22 is satisfactory as long as it includes at least one condenser lens, and may include a plurality of optical elements.

The optical fiber 23 is disposed such that the laser beams exited from the first condensing optical system 22 is condensed at the center of the −Z side lateral edge face of the core. In the present embodiment, for example, an optical fiber where the core diameter is 1.5 mm is used as the optical fiber 23.

The laser beams incident on the optical fiber 23 propagate through the core, and exit from the +Z side lateral edge face of the core.

Due to the provision of the optical fiber 23, the surface-emitting laser 21 may be disposed at a position distant from the laser resonator 25. Accordingly, the degree of flexibility in the arrangement of the surface-emitting laser 21 or the first condensing optical system 22 increases. Moreover, the surface-emitting laser 21 can be disposed at a position away from high-temperature regions around the engine 10. Accordingly, the engine 10 can be cooled using a variety of methods. Further, the surface-emitting laser 21 can be disposed at a position away from the engine 10 that is a vibration source. Accordingly, the deflection of the laser beams that are emitted from the surface-emitting laser 21 can be prevented.

The second condensing optical system 24 is disposed in the optical path of the laser beams emitted from the optical fiber 23, and concentrates the light emitted from the optical fiber 23. The laser beams that are concentrated by the second condensing optical system 24 enters the laser resonator 25. In the present embodiment, the second condensing optical system 24 includes, for example, a first lens 241 and a second lens 242.

The first lens 241 is a collimator lens that approximately collimates the laser beams emitted from the optical fiber 23.

The second lens 242 is a condenser lens that approximately concentrates the laser beams that are approximately collimated by the first lens 241.

The second condensing optical system 24 is satisfactory as long as it includes at least one condenser lens. The second condensing optical system 24 may consist of one optical element, or may include three or more lenses.

The laser resonator 25 is a Q-switched laser resonator. In the present embodiment, the laser resonator 25 includes a laser medium 251 and a saturable absorber 252. In the laser resonator 25, the energy density of the incident laser beams is increased, and the laser beams whose wavelengths are, for example, about 1064 nm are emitted with short pulse widths.

The laser medium 251 is an approximately cuboid-shaped neodymium (Nd): yttrium aluminum garnet (YAG) crystal, where 1.1 percent Nd is doped.

The saturable absorber 252 is an approximately cuboid-shaped chromium (Cr): YAG crystal. The optical transmittance of the saturable absorber 252 changes depending on the amount of absorption of laser beams, and the initial transmittance is about 0.50 (50%). When the amount of absorption of laser beams is small, the saturable absorber 252 serves as an absorber, and when the amount of absorption of laser beams is saturated, the saturable absorber 252 becomes transparent. As the saturable absorber 252 becomes transparent, Q-switch oscillation occurs.

The Nd: YAG crystal and the Cr: YAG crystal are both ceramic. The production cost of ceramics is lower than that of single crystal and inexpensive. In the present embodiment, the Nd: YAG crystal and the Cr: YAG crystal are bonded together to form a so-called composite crystal. Accordingly, the boundary between the Nd: YAG crystal and the Cr: YAG crystal is not detached, and the properties and characteristics equivalent to those of single crystal can be achieved in the laser resonator 25.

The surface (incident plane 251a) of laser medium 251 on the incident side (−Z side) and the surface (exit plane 252b) of the saturable absorber 252 on the light-exiting side (+Z side) are optically polished, and each of the surfaces serves as a mirror.

Further, dielectric layers are formed on the incident plane 251a and the exit plane 252b according to the wavelength of the light that is emitted from the surface-emitting laser 21 (e.g., 808 nm) and the wavelength of the laser beams that exit from the laser resonator 25 (e.g., 1064 nm). For example, a dielectric layer that indicates sufficiently high transmittance to the laser beams having a wavelength of 808 nm and indicates sufficiently high reflectance to the laser beams having a wavelength of 1064 nm are formed on the incident plane 251a. For example, a dielectric layer that indicates reflectance of about 50 percent to the laser beams having the wavelength of 1064 nm is formed on the exit plane 252b.

The laser beams that are concentrated by the second condensing optical system 24 enters the laser resonator 25. Then, the laser beams are resonated and amplified inside the laser resonator 25. Moreover, the laser medium 251 is optically pumped by the laser beams that are incident on the laser medium 251. Note that the wavelength of the laser beams that are emitted from the surface-emitting laser 21 (e.g., 808 nm in the present embodiment) is a wavelength where the absorption efficiency is the highest in the YAG crystal. The laser beams that are emitted from the surface-emitting laser 21, and then pass through the first condensing optical system 22 and the optical fiber 23 and become incident on the laser medium 251 may be referred to as pump light.

As the laser beams are resonated and amplified inside the laser resonator 25, the energy density of the laser beams is increased. When the amount of absorption of laser beams is saturated in the saturable absorber 252, Q-switch oscillation occurs in the saturable absorber 252. Accordingly, the laser beams of high energy density are emitted from the laser resonator 25 with a short pulse width and concentrated energy. The laser beams that are emitted from the laser resonator 25 may be referred to as a pulsed laser beam. The wavelength of such a pulsed laser beam is, for example, about 1064 nm.

The laser beams that are amplified by the laser resonator 25 are incident on the third condensing optical system 26.

The third condensing optical system 26 is disposed in the optical path of the laser beams that are emitted from the laser resonator 25. The third condensing optical system 26 concentrates the laser beams that are emitted from the laser resonator 25 to obtain a high energy density at a focal point. When the energy density of the concentrated laser beams exceeds a certain degree, the molecules that make up the gas included in the inflammable fuel-air mixture in the combustion chamber 14 are ionized, and are separated into positive ions and electrons.

In other words, the molecules are broken down into plasma.

In the present embodiment, the third condensing optical system 26 consists of a third lens 261, a fourth lens 262, and a fifth lens 263.

The third lens 261 is an optical element that increases the divergence angle of the laser beams that are emitted from the laser resonator 25, and a concave lens is used as the third lens 261 in the present embodiment.

The fourth lens 262 is an optical element that collimates the light diverging from the third lens 261, and a collimator lens is used as the fourth lens 262 in the present embodiment.

The fifth lens 263 is an optical element that concentrates the laser beams emitted from the fourth lens 262, and a condenser lens is used as the fifth lens 263 in the present embodiment.

As the laser beams are concentrated by the fifth lens 263, a high energy density can be obtained at a focal point. When the energy density of the concentrated laser beams exceeds a certain degree, the molecules that make up the gas included in the inflammable fuel-air mixture in the combustion chamber 14 are ionized, and plasma is generated.

The third condensing optical system 26 can adjust the focal point of the light that is emitted from the laser device 11 in the Z-axis direction by adjusting the positions of the lenses of the third condensing optical system 26 in the optical-axis direction of the lenses or by changing the combination of the lenses of the third condensing optical system 26.

The third condensing optical system 26 according to the present embodiment consists of three lenses. However, third condensing optical system 26 is satisfactory as long as it includes at least one condenser lens, and may include only one optical element or a plurality of optical elements.

Next, before describing a configuration of the window 27A, the housing 28 is described. As illustrated in FIG. 2, the housing 28 accommodates the second condensing optical system 24, the laser resonator 25, the third condensing optical system 26, and an optical window 271 of the window 27A. In the present embodiment, the housing 28 consists of the first housing 28-1 and the second housing 28-2. The first housing 28-1 accommodates the second condensing optical system 24 and the laser resonator 25, and
The second housing 28-2 accommodates the third condensing optical system 26 and the optical window 271.

The housing 28 is made of, for example, a heat-resistant metallic material such as iron (Fe), Ni—Fe alloy, Ni—Cr—Fe alloy, Ni—Co—Fe alloy, and stainless steel. The Ni—Cr—Fe alloy may be, for example, Inconel, and
The Ni—Co—Fe alloy may be, for example, Kovar.

Next, the configuration of the window 27A according to the present embodiment is described.

Figure 3:
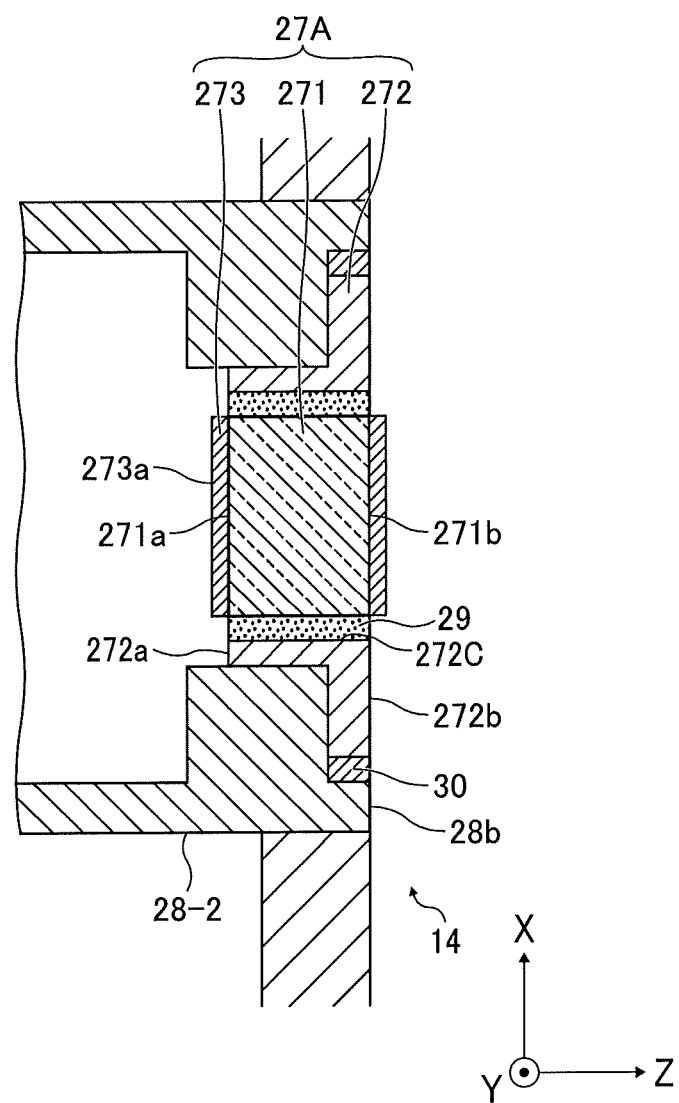
FIG. 3 is a sectional view of an example configuration of a window, according to an embodiment of the present disclosure.

FIG. 3 is a diagram illustrating an example configuration of the window 27A, according to the present embodiment.

As illustrated in FIG. 3, the window 27A includes an optical window (main unit of window) 271, an optical window holding member 272, an antireflection (AR) film 273, and a catalyst layer 274. In the present embodiment, the antireflection film 273 is arranged as a film formed on the incident plane 271a of the optical window 271 through which the laser beams pass, and the catalyst layer 274 is arranged as a film formed on the exit plane 271b of the optical window 271 through which the laser beams pass.

The optical window 271 is disposed in the optical path of the laser beams that are emitted from the third condensing optical system 26. The optical window 271 is made of a transparent or semitransparent material, and includes an incident plane 271a on which the laser beams are incident and an exit plane 271b from which the laser beams exit. The incident plane 271a is the surface of the optical window 271 on the third condensing optical system 26 side, and the laser beams pass through the incident plane 271a. The incident plane 271a is on the same plane as an incident-side end surface 272a that is an edge of the optical window holding member 272 on the incident-side of the laser beams. The exit plane 271b is the surface of the optical window 271 on the combustion chamber 14 side, and the laser beams pass through the exit plane 271b. The exit plane 271b is on the same plane as an exit-side end surface 272b that is an edge of the optical window holding member 272 on the exit-side of the laser beams. In the present embodiment, it is assumed that the incident-side end surface 272a and the exit-side end surface 272b that are the edges of the optical window holding member 272 are planar. However, the incident-side end surface 272a and the exit-side end surface 272b may be, for example, curved or convex.

The optical window 271 is fixed on the inside surfaces of the optical window holding member 272, by a brazing member 29 that is formed by using a brazing material (binder). The optical window 271 is disposed at an opening that is formed on the surface of the housing 28 on the combustion chamber 14 side. The laser beams that are emitted from the third condensing optical system 26 pass through the optical window 271 and are concentrated inside the combustion chamber 14.

Note also that the shape of the optical window 271 in a planar view is not limited, and may be, for example, rectangular, circular, ellipsoidal, rectangular, or polygonal.

For example, an optical glass, a heat-resistant glass, a quartz glass, and a sapphire glass may be used as a material of the optical window 271. In particular, the optical window 271 needs sufficient pressure resistance to protect, for example, the optical elements inside the housing 28, from the firing pressure produced inside the combustion chamber 14. In order to achieve such sufficient pressure resistance, the thickness of the optical window 271 may be increased. However, if the thickness of the optical window 271 is increased, some of the laser beams that are incident on the exit plane of the optical window 271 tends to be reflected and concentrated inside the optical window 271. In order to prevent the concentration of light inside the optical window 271, the focal length of the third condensing optical system 26 needs to be extended.

When the focal length of the third condensing optical system 26 is extended, the numerical aperture (NA) of the lenses of the third condensing optical system 26 becomes small. Accordingly, the light-gathering power decreases, and the ignition quality decreases. For this reason, it is desired that the thickness of the optical window 271 be as thin as possible. In order to handle such a situation, it is desired that sapphire glass be used as the material of the optical window 271. The sapphire glass exhibits good durability under high-temperature and high-pressure environments.

The optical window holding member 272 is attached around the opening that is formed on the surface of the housing 28 on the combustion chamber 14 side, so as to cover the housing 28. The optical window holding member 272 is fixed to the housing 28 through a welded portion 30 that is formed, for example, by laser welding. In the present embodiment, the optical window holding member 272 is fixed to the housing 28 by welding such as laser welding. However, no limitation is indicated thereby, and the optical window holding member 272 may be fixed to the housing 28 by, for example, fastening screw, shrinkage fit, and adhesion.

An exit-side end surface 272b of the optical window holding member 272 and an end face 28b of a second housing 28-2 are approximately on the same geometric plane. Due to this configuration, when the welded portion 30 is formed, for example, by laser welding, it is easy to concentrate the laser beams onto the welded portion 30. As a result, the welded portion 30 can evenly be disposed between the optical window holding member 272 and the second housing 28-2, with high stability and reliability. Accordingly, the optical window holding member 272 can be fixed onto the second housing 28-2 with high stability.

The optical window 271 is fixed on inside surface (inner wall) 272c of the optical window holding member 272, by the brazing member 29. In the present embodiment, a brazing material is used as the binder. However, no limitation is indicated thereby, and other kinds of heat-resistant binder may be employed. The optical window 271 may be fixed to the optical window holding member 272 by means of fastening screw, shrinkage fit, or the like, without using binder.

For example, a heat-resistant metallic material such as iron (Fe), nickel (Ni), Ni—Fe alloy, Ni—Cr—Fe alloy, Ni—Co—Fe alloy, and stainless steel may be used as a material that forms the optical window holding member 272. The Ni—Cr—Fe alloy may be, for example, Inconel, and the Ni—Co—Fe alloy may be, for example, Kovar (trademark of CRS Holdings, inc., Delaware). Above all, it is most strongly desired that the optical window 271 be made of sapphire in the present embodiment. For this reason, it is desired that a material that forms the optical window holding member 272 be Kovar whose coefficient of thermal expansion is close to that of sapphire.

In the present embodiment, it is desired that the optical window holding member 272 be formed of a material having the same coefficient of thermal expansion as the second housing 28-2 on which the optical window holding member 272 is fixed. In the present embodiment, the optical window holding member 272 and the second housing 28-2 are formed of the same material. However, the optical window holding member 272 and the second housing 28-2 may be made of different materials as long as these materials have the same coefficient of thermal expansion. As the optical window holding member 272 and the second housing 28-2 are formed of a material having the same coefficient of thermal expansion, the compressive stress that could be caused by the difference in coefficient of thermal expansion can be prevented from being applied to the brazing material and the welded portion 30. Note that the expression "the same coefficient of thermal expansion" indicates not only the precisely identical value, but also allows an error of about several percent as stress difference that does not affect the brazing material or the welded portion 30.

The reasons why it is desired that the optical window holding member 272 and the second housing 28-2 be formed of a material having the same coefficient of thermal expansion are described. As the optical window holding member 272 and the second housing 28-2 is exposed to the combustion chamber 14, the optical window holding member 272 and the second housing 28-2 are susceptible to the temperature of the combustion chamber 14. For this reason, when the mixture of gases are burning in the combustion chamber 14, the temperature of the optical window holding member 272 and the second housing 28-2 increases, for example, to about several hundred degrees Celsius to about 1000 degrees Celsius.

Here, it is assumed that the optical window holding member 272 and the second housing 28-2 are formed of two or more materials having different coefficients of thermal expansion. In such cases, when the inside of the combustion chamber 14 is at high temperature, compressive stress is caused due to the difference in coefficient of thermal expansion between the optical window holding member 272 and the second housing 28-2. Due to such compressive stress, the load on the brazing member 29 or the welded portion 30 may increase as, for example, the brazing member 29 or the welded portion 30 may be stretched, or cracks may appear on the brazing member 29 or the welded portion 30. As a result, the brazing member 29 or the welded portion 30 may deteriorate.

By contrast, as long as the optical window holding member 272 and the second housing 28-2 are formed of a material having the same coefficient of thermal expansion, even if the temperature of the optical window holding member 272 and the second housing 28-2 increases, for example, to high temperature of about several hundreds of degrees Celsius to about 1000 degrees Celsius as affected by the temperature of the combustion chamber 14, the compressive stress that could be caused due to the difference in coefficient of thermal expansion is not applied to the brazing member 29 and the welded portion 30. For this reason, the brazing member 29 or the welded portion 30 is not stretched or cracked, for example, due to the stress caused between the optical window holding member 272 and the second housing 28-2. In other words, the load on the brazing member 29 and the welded portion 30 can be reduced. Accordingly, the optical window 271 can be fixed to the optical window holding member 272 with high stability.

In the present embodiment, it is desired that the optical window holding member 272 and the second housing 28-2 be made of a material such as Kovar. Among all sorts of metal, Kovar has a low coefficient of thermal expansion near normal temperature, and the coefficient of thermal expansion of Kovar is close to that of a hard glass such as sapphire glass. For example, as Kovar is adopted as the material of the optical window holding member 272 and the second housing 28-2, when the optical window 271 is made from sapphire, thermal strain is caused in a similar manner between the optical window 271, and the optical window holding member 272 and the second housing 28-2. Accordingly, the stress that is caused between the optical window 271, and the optical window holding member 272 and the second housing 28-2, due to the difference in coefficient of thermal expansion, can be reduced.

Due to this configuration, the stress that is caused by the difference in coefficient of thermal expansion can be prevented from being applied to the brazing member 29 that is disposed between the optical window 271 and the optical window holding member 272. Moreover, the stress can also be prevented from being applied to the welded portion 30 that is disposed between the optical window holding member 272 and the second housing 28-2. Accordingly, the load on the brazing member 29 and the welded portion 30 can further be reduced.

Due to this configuration, when the optical window holding member 272 and the second housing 28-2 are formed of a material having the same coefficient of thermal expansion in the laser device 11, a reduction in the light quantity of laser beams that enter the combustion chamber 14 can further be attenuated with increased stability. Moreover, in the laser device 11, the optical window 271 can be fixed to the optical window holding member 272 with high stability. Due to this configuration, even when the inside of the combustion chamber 14 is under high temperature environments due to combustion, the laser device 11 can be used with high stability on a long-term basis. Accordingly, a highly-reliable laser device is achieved.

In the present embodiment, the second housing 28-2 on which the optical window holding member 272 is fixed is formed of a material having the same coefficient of thermal expansion as the optical window holding member 272. However, no limitation is intended thereby. For example, the first housing 28-1 and the second housing 28-2 may be formed of a material having the same coefficient of thermal expansion as the optical window holding member 272.

The antireflection film 273 is a film that is formed on the incident plane 271a of the optical window 271 to prevent the laser beams from being reflected. In the present embodiment, the antireflection film 273 has a high optical transmittance for the laser beams with wavelengths of 1064 nm.

The antireflection film 273 may be made of, for example, a material whose main component is one of silicon (Si), sodium (Na), aluminum (Al), calcium (Ca), magnesium (Mg), boron (B), carbon (C), titanium (Ti), vanadium (V), chromium (Cr), manganese (Mn), iron (Fe), cobalt (Co), nickel (Ni), copper (Cu), zinc (Zn), gallium (Ga), strontium (Sr), zirconium (Zr), niobium (Nb), ruthenium (Ru), palladium (Pd), silver (Ag), indium (In), tin (Sn), hafnium (Hf), tantalum (Ta), tungsten (W), osmium (Os), gold (Au), and bismuth (Bi), or a material that includes at least one of a nitride, oxide, carbide, and a fluoride of the above main component.

In particular, for example, magnesium fluoride ($MgF_2$), silicon nitride ($Si_3N_4$), and silicon dioxide ($SiO_2$) may be used. The less difference in refractive index between the antireflection film 273 and the optical window 271, the more the antireflective properties and characteristics improves.

As a method of forming the antireflection film 273 on the optical window 271, for example, vapor deposition, sputtering, thermal spraying (flame plating), coating, or sol-gel processes may be used.

It is desired that the antireflection film 273 be formed on the incident plane 271a of the optical window 271, for example, in a state where the optical window 271 is fixed to the optical window holding member 272 by brazing or the like. When the optical window 271 is fixed to the optical window holding member 272, the optical window holding member 272 is heated to a high temperature, and thus the optical window 271 also tends to be heated to a high temperature. For example, when the optical window 271 is fixed to the optical window holding member 272 using a brazing material, the optical window 271 is heated to a high temperature (for example, about 1000° C.). In so doing, the heat resistance of the antireflection film 273 may be not as high as the above temperature. The heat resistance of the antireflection film 273 is, for example, about 400° C. For this reason, it is desired that the antireflection film 273 be formed on the incident plane 271a of the optical window 271 in a state where the optical window 271 is fixed to the optical window holding member 272.

In the present embodiment, the antireflection film 273 is designed to have thickness enabling a high optical transmittance for the laser beams with wavelengths of 1064 nm. For example, when the optical window 271 is made from sapphire glass, the refractive index of the sapphire is about 1.74. Accordingly, it is desired that the thickness of the antireflection film 273 be about 202 nm and the refractive index of the antireflection film 273 be about 1.32.

In the present embodiment, the thickness of the antireflection film 273 indicates the length of the antireflection film 273 in the vertical direction with reference to the contact surface with the optical window 271. For example, the thickness of the antireflection film 273 is obtained by measuring any desired position of the cross section of the antireflection film 273.

As illustrated in FIG. 3, in the present embodiment, the incident plane 271a of the optical window 271 and the incident-side end surface 272a of the optical window holding member 272 are approximately on the same geometric plane. Due to this configuration, the incident plane 271a of the optical window 271 is not recessed towards the light exiting side with reference to the incident-side end surface 272a of the optical window holding member 272, but the incident plane 271a of the optical window 271 and the incident-side end surface 272a of the optical window holding member 272 are substantially on the same plane. Accordingly, the antireflection film 273 where the variations in average thickness are small can be formed with stability on the incident plane 271a of the optical window 271 and the incident-side end surface 272a of the optical window holding member 272.

When the variations in thickness are small in the antireflection film 273, the reflection of some of the laser beams that are incident on the incident plane 273a of the antireflection film 273 can further be reduced, and the reduction in the transmittance of the laser beams can further be controlled. As a result, a reduction in the light quantity of laser beams that enter the combustion chamber 14 can be controlled. Moreover, the reflection of some of the laser beams that are incident on the antireflection film 273 and the concentration of the reflected laser beams onto the third condensing optical system 26 or the like can further be controlled. Due to this configuration, damage to an optical element such as the third condensing optical system 26 can be prevented.

In the present embodiment, it is desired that the surface roughness Ra of the antireflection film 273 be equal to or less than 100 nm. It is more desirable if the surface roughness Ra of the antireflection film 273 is equal to or less than 50 nm, and it is even more desirable if the surface roughness Ra of the antireflection film 273 is equal to or less than 10 nm. Although it is undesired, some of the laser beams that are incident on the incident plane 273a of the antireflection film 273 are reflected on the incident plane 273a of the antireflection film 273. However, when the surface roughness Ra of the antireflection film 273 is equal to or less than 100 nm, the laser beams that are incident on the incident plane 273a of the antireflection film 273 can further be prevented from being reflected on the entirety of the incident plane 273a of the antireflection film 273.

In the present embodiment, the surface roughness Ra of the antireflection film 273 is the average of the concave and convex states on the surface of the antireflection film 273 on the incident-side of the laser beams. The surface roughness Ra is arithmetic average roughness, and indicates a value measured in accordance with Japanese Industrial Standards (JIS) B 0601 (2013). The surface roughness Ra may be measured, for example, by a known surface-roughness measuring instrument.

In the present embodiment, the antireflection film 273 is formed across the incident plane 271a of the optical window 271 and the incident-side end surface 272a of the optical window holding member 272. Alternatively, when the antireflection film 273 is to be formed only on the incident plane 271a of the optical window 271, for example, a mask needs to be disposed at portions where the antireflection film 273 is not to be formed. Due to such a step where a mask is disposed, the positions at which the antireflection film 273 is to be formed may be misaligned. Due to the arrangement in which the antireflection film 273 is formed across the incident plane 271a and the incident-side end surface 272a, the antireflection film 273 is formed with reliability on the plane through which the laser beams pass, and the cost required to form the antireflection film 273 can be reduced.

In the present embodiment, the antireflection film 273 has single-layer structure. However, no limitation is intended thereby, and the antireflection film 273 may have multilayer structure.

The catalyst layer 274 is formed on the exit plane 271b of the optical window 271, and enhances the oxidation-reduction reaction.

The catalyst layer 274 may be formed of an aggregate of particulate photocatalysts. For this reason, a photocatalyst may be made from titanium dioxide ($TiO_2$), tungsten trioxide ($WO_3$), ferric oxide ($Fe_2O_3$), molybdenum disulfide ($MoS_2$), silicon (Si), cuprous oxide ($Cu_2O$), roquesite ($CuInS_2$), TaON, carbon nitride ($C_3N_4$), silicon carbide (SiC), strontium titanate ($SrTiO_3$), gallium phosphide (GaP), gallium arsenide (GaAs), cadmium selenide (CdSe), cadmium sulfide (CdS), or zinc oxide (ZnO). These materials may be used independently or in combination. In particular, it is desired that $TiO_2$ be used as the material of a photocatalyst.

When the photocatalyst is $TiO_2$, it is desired that $TiO_2$ has crystal structure of anatase type, rutile type, or brookite type. As $TiO_2$ whose crystal structure is of anatase type has the highest reactivity among the above three types of crystal structure, it is desired that $TiO_2$ of anatase type be used.

The functionality of photocatalyst varies depending on the material of that photocatalyst. In order for the photocatalyst to function as a photocatalyst, the photocatalyst needs to be irradiated with light with photon energy (wavelength) corresponding to the band gap of the photocatalyst or light with even greater photon energy (wavelength). When the photocatalyst is irradiated with light with wavelength having a value equal to or shorter than a predetermined value, the photocatalyst absorbs light, and electrons and electron holes are generated. These generated electron holes directly contribute to oxidation reaction, and organic matters are decomposed. Moreover, the electron holes react with the moisture or hydroxyl (—OH) on the surfaces of crystal, and hydroxyl radical (OH) is generated. "OH" contributes to oxidation reaction and is strongly oxidative. Accordingly, organic matters are oxidized and decomposed. The generated electrons deoxidize the oxygen existing on the surfaces of the photocatalyst to generate a superoxide ion ($O^{2-}$). $O^{2-}$ reacts with the moisture on the surfaces of crystal, and hydrogen peroxide or "OH" is generated. Hydrogen peroxide or "OH" contribute to oxidation reaction and is strongly oxidative. Accordingly, organic matters are oxidized and decomposed.

When the photocatalyst in the catalyst layer 274 manifests itself and functions as a photocatalyst, the light that is generated as the laser beams are concentrated inside the combustion chamber 14 and become plasmic, the air that is supplied to the combustion chamber 14, and the molecules of water that exists inside the combustion chamber 14 are used. Due to this configuration, the photocatalyst in the catalyst layer 274 manifests itself and functions as a photocatalyst, and for example, organic matters are decomposed.

As known in the art, in the engine 10, engine oil is used in order to reduce, for example, the friction in the piston 15, and oil mist is floating inside the combustion chamber 14. Accordingly, in the known windows, for example, oil mist sticks to a plane of the window on the combustion chamber side. Moreover, when, for example, soot is accumulated and soot deposits are formed, the light quantity of laser beams that enter the combustion chamber 14 may decrease, and the ignition stability may deteriorate.

In the present embodiment, the catalyst layer 274 is formed on the exit plane 271b of the optical window 271. Due to this configuration, even when, for example, the organic matters and the soot generated inside the combustion chamber 14 stick to the surface of the catalyst layer 274, such organic matters and soot can be decomposed. For this reason, stains or the like can be prevented from sticking to the surfaces of the catalyst layer 274. Accordingly, the catalyst layer 274 can maintain the transmittance of the laser beams that are emitted from the third condensing optical system 26, and thus the light quantity of laser beams that enter the combustion chamber 14 can be maintained.

The exit plane 271b of the optical window 271 and the exit-side end surface 272b of the optical window holding member 272 are arranged approximately on the same geometric plane. The exit plane 271b of the optical window 271 may protrude to the combustion chamber 14 side, which is on the light exiting side with reference to the exit-side end surface 272b of the optical window holding member 272 (see FIG. 5A). As will be described later, if the exit plane 271b of the optical window 271 is disposed on the light entering side with reference to the exit-side end surface 272b of the optical window holding member 272, the materials that form the catalyst layer 274 may contact the optical window holding member 272 or the brazing member 29 when the catalyst layer 274 is formed on the optical window 271. Due to this configuration, the variations in the thickness of the catalyst layer 274 or the thickness of the catalyst layer 274 tend to increase. Moreover, the transmittance may also deteriorate.

In the present embodiment, the exit plane 271b of the optical window 271 and the exit-side end surface 272b of the optical window holding member 272 are approximately on the same geometric plane. Due to this configuration, the catalyst layer 274 can be formed on the exit plane 271b of the optical window 271 without being affected by the optical window holding member 272 and the brazing member 29. the catalyst layer 274 where the variations in thickness are small and the thickness is small can easily be formed.

In the present embodiment, it is desired that the thickness of the catalyst layer 274 be equal to or smaller than 1 micrometer (μm). When the thickness of the catalyst layer 274 exceeds 1 μm, there is a possibility that the optical transmittance of the catalyst layer 274 decreases and the laser beams cannot be maintained with high transmittance. As the reduction in transmittance degrades the intensity of the laser beams that are emitted from the laser resonator 25, the laser beams may become plasmatic and the light intensity may deteriorate. For this reason, the combustion efficiency of the engine 10 may deteriorate, or in some cases, the fire could be lost.

Note also that as long as the catalyst layer 274 has a high optical transmittance and can be formed on the optical window 271 with stability, the lower limit of the thickness of the catalyst layer 274 is not limited to any specific range of values. In view of the optical transmittance of the catalyst layer 274, it is desired that the thickness of the catalyst layer 274 be thin. However, the surface of the optical window 271 is highly water-repellent in many cases. For this reason, if the catalyst layer 274 is too thin and when the catalyst layer 274 is directly formed onto the optical window 271, there is a possibility that the catalyst layer 274 cannot be formed on the optical window 271 with stability. In particular, when the optical window 271 is made of sapphire that is highly water-repellent, the catalyst layer 274 cannot easily be formed on the optical window 271 in many cases. For the above reasons, the lower limit of the thickness of the catalyst layer 274 is adjusted as appropriate according to the material of the optical window 271.

Moreover, it is desired that, in order to prevent the reflection of the laser beams, the catalyst layer 274 be further adjusted to have appropriate thickness in view of the incident light and the refractive index of the catalyst layer 274. For example, when the catalyst layer 274 is a single layer, $n_{AR1}$ that denotes the refractive index of the catalyst layer 274 is expressed in Equation 1 given below, and $d_{AR1}$ that denotes the thickness of the catalyst layer 274 is expressed in Equation 2 given below. Note also that $n_{AR1}$ and $d_{AR1}$ are calculated so as to minimize the reflectance of the catalyst layer 274. In these equations, $n_0$ denotes the refractive index of the air ($n_0=1$), and $n_m$ denotes the refractive index of the optical window 271. Further, λ denotes the wavelengths of the laser beams (1064 nm).

$$n_{AR1} = \sqrt{(n_0 \times n_m)} \qquad \text{[Equation 1]}$$

$$d_{AR1} = \lambda/(4 \times n_{AR1}) \qquad \text{[Equation 2]}$$

For example, when the material of the optical window 271 is sapphire, the refractive index is 1.74. In such a configuration, $n_{AR1}$ becomes 1.32, and $d_{AR1}$, i.e., the thickness of the catalyst layer 274, is set to 201.5 nm. By so doing, the single layer of the catalyst layer 274 can achieve high antireflective functionality. Due to this configuration, when the catalyst layer 274 is a single layer, it is desired that the thickness of the catalyst layer 274 and the refractive index of the catalyst layer 274 be adjusted to become close to the values that are obtained from the above Equations 1 and 2.

In the present embodiment, the thickness of the catalyst layer 274 can be defined in a similar manner to the thickness of the antireflection film 273, and the thickness of the catalyst layer 274 can be measured in a similar manner to the antireflection film 273.

It is desired that the average diameter of the particles of photocatalyst that form the catalyst layer 274 be equal to or shorter than 100 nm. In order for the photocatalyst to function as a photocatalyst, it is desired that a number of electrons and holes be formed on the surface of the photocatalyst. In order for the electrons and holes to appear on the surface of the photocatalyst, it is desired that the particles of the photocatalyst be smaller. By contrast, when the particles of the photocatalyst is large, the transparency of the catalyst layer 274 may decrease. For the above reasons, it is desired that the average diameter of the particles of photocatalyst that form the catalyst layer 274 be equal to or shorter than 100 nm. Due to such a configuration, the transmittance of the laser beams in the catalyst layer 274 can be maintained, while the catalyst layer 274 functioning as a photocatalyst.

Note that the average diameter of the particles (average particle diameter) of the photocatalyst is obtained as follows. Firstly, a desired number of photocatalysts (for example, a hundred photocatalysts) are observed using a transmission electron microscope (TEM), and its projected area is measured. Then, the circle-equivalent diameter of the obtained area is calculated, and the particle diameters are obtained. Finally, the average of the obtained particle diameters is obtained as the average particle diameter.

The catalyst layer 274 may be formed on the optical window 271 using a method known in the art. For example, vapor deposition, sputtering, thermal spraying (flame plating), coating, or sol-gel processes may be used to form the catalyst layer 274 on the optical window 271.

It is desired that the catalyst layer 274 be formed on the exit plane 271b of the optical window 271 in a state where the optical window 271 is fixed to the optical window holding member 272 and the antireflection film 273 is formed on the incident plane 271a of the optical window 271. When the optical window 271 is fixed to the optical window holding member 272 or when the antireflection film 273 is fixed to the optical window 271, the optical window 271 and the antireflection film 273 are heated at high temperature (for example, about 1000° C.). Accordingly, the optical window 271 also tends to be heated to a high temperature. For example, when the optical window 271 is fixed to the optical window holding member 272 using a brazing material, the optical window 271 is heated to a high temperature (for example, about 1000° C.). In so doing, in a similar manner to the antireflection film 273, the heat resistance of the catalyst layer 274 may be not as high as the above temperature. Depending on the materials that form the catalyst layer 274, the crystal structure may be changed due to the heating temperature. For this reason, it is desired that the catalyst layer 274 be formed on the exit plane 271b of the optical window 271 in a state where the optical window 271 is fixed to the optical window holding member 272 and the antireflection film 273 is formed on the incident plane 271a of the optical window 271. For example, when the catalyst layer 274 is made from $TiO_2$, it is desired that the catalyst layer 274 be heated at temperature equal to or lower than, for example, 650° C. When the heating temperature exceeds 650° C., the crystalline state of $TiO_2$ ends up changing from anatase type to rutile type whose reactivity is lower than the anatase type.

The catalyst layer 274 is formed across the exit plane 271b of the optical window 271 and the exit-side end surface 272b of the optical window holding member 272. Alternatively, when the catalyst layer 274 is to be formed only on the exit plane 271b of the optical window 271, for example, a mask needs to be disposed at portions where the catalyst layer 274 is not to be formed. Due to such a step where a mask is disposed, the positions at which the catalyst layer 274 is to be formed may be misaligned. Due to the arrangement in which the catalyst layer 274 is formed across the exit plane 271b and the exit-side end surface 272b, the catalyst layer 274 is formed with reliability on the plane through which the laser beams pass, and the cost required to form the catalyst layer 274 can be reduced.

In the present embodiment, the catalyst layer 274 has single-layer structure. However, no limitation is intended thereby, and the catalyst layer 274 may have multilayer structure.

As described above, the laser device 11 is provided with the antireflection film 273, where the variations in thickness are small, on the incident plane 271a of the optical window 271 that is on the same plane as the incident-side end surface 272a of the optical window holding member 272. Due to this configuration, the laser beams that are emitted from the laser resonator 25 can further be prevented from being reflected on the antireflection film 273. Accordingly, a reduction in the light quantity of the laser beams that enter the combustion chamber 14 can further be attenuated. Due to this configuration, the laser device 11 can maintain the light quantity of laser beams that enter the combustion chamber 14.

Moreover, the laser device 11 is provided with the catalyst layer 274 on the exit plane 271b of the optical window 271 that is on the same plane as the exit-side end surface 272b of the optical window holding member 272. Due to this configuration, oil mist inside the combustion chamber or stain such as soot can be prevented from sticking to the exit plane 271b. As a result, the transmittance of the pulsed laser beams in the catalyst layer 274 can be maintained, and thus the light quantity of laser beams that enter the combustion chamber 14 can be maintained.

As described above, in the laser device 11, is provided with the antireflection film 273 that is formed on the incident plane 271a of the optical window 271, and is provided with the catalyst layer 274 that is formed on the exit plane 271b of the optical window 271. Due to this configuration, plasma can be produced with stability in the combustion chamber 14. Accordingly, ignition can be performed with high stability in the combustion chamber 14.

In the present embodiment, the antireflection film 273 is formed across the incident plane 271a of the optical window 271 and the incident-side end surface 272a of the optical window holding member 272, and the catalyst layer 274 is formed across the exit plane 271b of the optical window 271 and the exit-side end surface 272b of the optical window holding member 272. Due to this configuration, the antireflection film 273 and the catalyst layer 274 can reliably be formed on the plane through which the laser beams pass, and the cost required to form the antireflection film 273 and the catalyst layer 274 can be reduced.

Furthermore, in the present embodiment, the surface roughness Ra of the antireflection film 273 is equal to or less than 100 nm. Due to this configuration, some of the laser beams that are incident on the incident plane 273a of the antireflection film 273 can further be prevented from being reflected. As a result, a reduction in the light quantity of laser beams that enter the combustion chamber 14 can be attenuated, and plasma can be produced with increased stability in the combustion chamber 14.

In the present embodiment, the thickness of the catalyst layer 274 is configured to be equal to or shorter than 1 μm. Due to this configuration, the reduction in the transmittance of the laser beams in the catalyst layer 274 can be controlled. Accordingly, the laser beams can be maintained with high transmittance.

In the present embodiment, the average diameter of the particles of photocatalyst that form the catalyst layer 274 is configured to be equal to or less than 100 nm. Due to this configuration, while the catalyst layer 274 functioning as a photocatalyst, the transmittance of the laser beams in the catalyst layer 274 can be maintained.

As the engine 10 (see FIG. 1) is provided with the laser device 11, the combustion efficiency can be maintained with stability. Accordingly, the performance of the engine 10 (see FIG. 1) can be stabilized.

<Modification>

In the present embodiment, the optical window 271 is provided with both the antireflection film 273 and the catalyst layer 274. However, no limitation is indicated thereby, and the optical window 271 may be provided with only either one of the antireflection film 273 and the catalyst layer 274. For example, in the present embodiment, the antireflection film 273 is formed on the incident plane 271a of the optical window 271. However, no limitation is indicated thereby, and when no disadvantage expected by the reflected light or the like, the antireflection film 273 may be omitted.

As illustrated in FIG. 3, in the present embodiment, the incident plane 271a of the optical window 271 and the incident-side end surface 272a of the optical window holding member 272 are approximately on the same geometric plane. However, no limitation is intended thereby. For example, as illustrated in FIG. 4A, the incident plane 271a may protrude to the third condensing optical system 26 side, which is on the incident side (in the −Z-axis direction) with reference to the incident-side end surface 272a of the optical window holding member 272. Even in this case, the antireflection film 273 where the surface roughness Ra is small can be formed on the incident plane 271a of the optical window 271. Due to this configuration, a reduction in the transmittance of the laser beams that are incident on the antireflection film 273 can be controlled all over the incident plane 273a of the antireflection film 273. As a result, a reduction in the light quantity of laser beams that enter the combustion chamber 14 can further be attenuated with increased stability. Moreover, the reflection of some of the laser beams that are incident on the optical window 271 and the concentration of the reflected laser beams onto the third condensing optical system 26 or the like can be controlled. Due to this configuration, damage to an optical element such as the third condensing optical system 26 can be prevented.

As illustrated in FIG. 4B, the incident plane 271a may be disposed at a depressed position with reference to the incident-side end surface 272a. When the incident plane 271a or the exit plane 271b of the optical window 271 are disposed at a depressed position, the incident plane 271a or the exit plane 271b of the optical window 271 is disposed on an inside surface 272c of the optical window holding member 272 so as to be recessed towards the inner side of the optical window holding member 272 with reference to the edges of the optical window holding member 272 (i.e., the incident-side end surface 272a or the exit-side end surface 272b). In FIG. 4B, the incident plane 271a is disposed on the inside surface 272c of the optical window holding member 272 so as to be recessed towards the light-exiting side in the +Z-axis direction with reference to the incident-side end surface 272a of the optical window holding member 272. In such a configuration, the inside surface 272c of the optical window holding member 272 needs to be formed such that the diameter of the inside surface 272c is enlarged (for example, in a tapered shape) from the position of the incident plane 271a of the optical window 271 towards the outside in the incident direction (i.e., in the −Z-axis direction). The angle that the incident plane 271a of the optical window 271 forms with a diameter-enlarged portion of the optical window holding member 272, which is formed from the position of the incident plane 271a towards the incident side, is wider than 90°. For example, when the optical system is tapered as illustrated in FIG. 4B, an angle θ1 that the incident plane 271a of the optical window 271 forms with a diameter-enlarged portion 272c1 of the inside surface 272c of the optical window holding member 272, which is formed from the position of the incident plane 271a towards the incident side, needs to be wider than 90°, and preferably 1000 or wider. The angle θ1 may be equal to or greater than 180°. When the angle θ1 is greater than 90°, the variations in thickness in the antireflection film 273 can be reduced on the entirety of the antireflection film 273 that is formed on the incident plane 271a. The diameter-enlarged portion 272c1 is a part of the inside surface 272c of the optical window holding member 272 where the internal diameter is enlarged from the position of the incident plane 271a of the optical window 271 towards the outside. When the optical window holding member 272 is viewed in the direction towards the light exiting side of the laser beams (in the +Z-axis direction), the shape of the diameter-enlarged portion 272c1 may be, for example, circular or rectangular.

In the present modification, for example, it is assumed that the antireflection film 273 is formed on the incident plane 271a in a state where the optical window 271 is fixed to the optical window holding member 272 such that the incident plane 271a is positioned on the light exiting side (in the +Z-axis direction) with reference to the incident-side end surface 272a. In such a configuration, points of the incident plane 271a of the optical window 271, which are close to the optical window holding member 272, tend to be in the shade of edges of the incident-side end surface 272a of the optical window holding member 272. For this reason, it is difficult to form the antireflection film 273 where the variations in thickness are small, on the incident plane 271a of the optical window 271. Due to such a configuration, it is likely that some of the laser beams that are incident on the incident plane 273a of the antireflection film 273 are reflected, and in some cases, the antireflection film 273 does not satisfactorily serve as an antireflection (AR) film. As a result, the transmittance of the laser beams decreases, and the light quantity of laser beams that enter the combustion chamber 14 may also decrease.

As illustrated in FIG. 3, in the present embodiment, the exit plane 271b of the optical window 271 and the exit-side end surface 272b of the optical window holding member 272 are approximately on the same geometric plane. However, no limitation is intended thereby. For example, as illustrated in FIG. 5A, the exit plane 271b of the optical window 271 may protrude to the combustion chamber 14 side, which is on the light exiting side (in the +Z-axis direction) with reference to the exit-side end surface 272b of the optical window holding member 272. Also in such a configuration as above, the catalyst layer 274 may be formed on the exit plane 271b of the optical window 271 without being affected by the optical window holding member 272 and the brazing member 29. Moreover, the catalyst layer 274 where the variations in thickness are small and the thickness is small can easily be formed.

In a similar manner to the alternative case of the incident plane 271a as described above, as illustrated in FIG. 5B, the exit plane 271b may be disposed at a depressed position with reference to the exit-side end surface 272b. In other words, the exit plane 271b is disposed on the inside surface 272c of the optical window holding member 272 so as to be recessed towards the light incident side in the −Z-axis direction with reference to the exit-side end surface 272b of the optical window holding member 272, and the exit plane 271b may be disposed at a depressed position towards the inner side of the optical window holding member 272. In such a configuration, the inside surface 272c of the optical window holding member 272 needs to be formed such that the diameter of the inside surface 272c is enlarged from the position of the exit plane 271b of the optical window 271 towards the outside in the light exit direction (i.e., in the +Z-axis direction). Moreover, an angle θ2 that the exit plane 271b of the optical window 271 forms with a diameter-enlarged portion 272c2 of the inside surface 272c of the optical window holding member 272, which is formed from the position of the exit plane 271b towards the light exiting side needs to be wider than 90°, and preferably 100° or wider, in a similar manner to the angle θ1. The angle θ2 may be equal to or greater than 180°. When the angle θ2 is greater than 90°, the variations in thickness can be reduced in the catalyst layer 274 that is formed on the exit plane 271b. In a similar manner to the diameter-enlarged portion 272c1 as above, the diameter-enlarged portion 272c2 is a part of the inside surface 272c of the optical window holding member 272 where the internal diameter is enlarged from the position of the exit plane 271b of the optical window 271 towards the outside. in a similar manner to the diameter-enlarged portion 272c1 as above,
When the optical window holding member 272 is viewed in the direction towards the light incident side of the laser beams (in the −Z-axis direction), the shape of the diameter-enlarged portion 272c1 may be, for example, circular or rectangular.

Figure 5C:
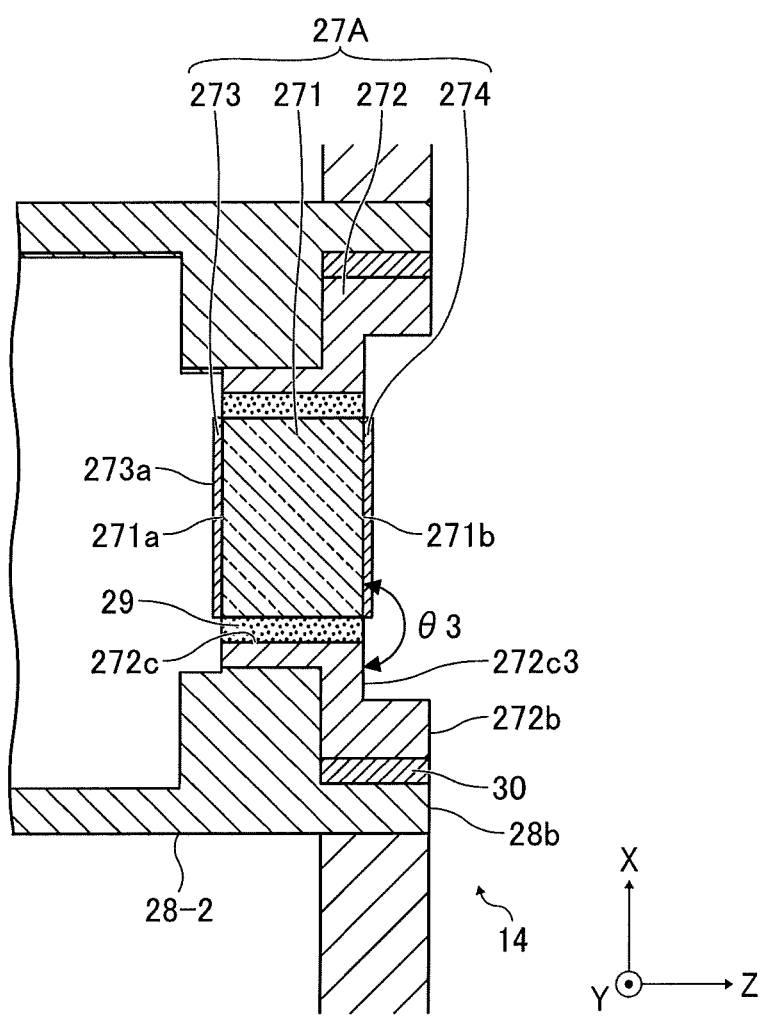
FIG. 5C is a sectional view of another example configuration of a window, according to an embodiment of the present disclosure.

FIG. 5C is a diagram illustrating a case in which the angle θ2 is 180°, according to an alternative embodiment of the present disclosure.

In other words, an angle θ3 that the exit plane 271b forms with a diameter-enlarged portion 272c3 of the optical window holding member 272 is 180°. Also in this configuration, the variations in thickness can be reduced in the catalyst layer 274 that is formed on the exit plane 271b.

Figure 6:
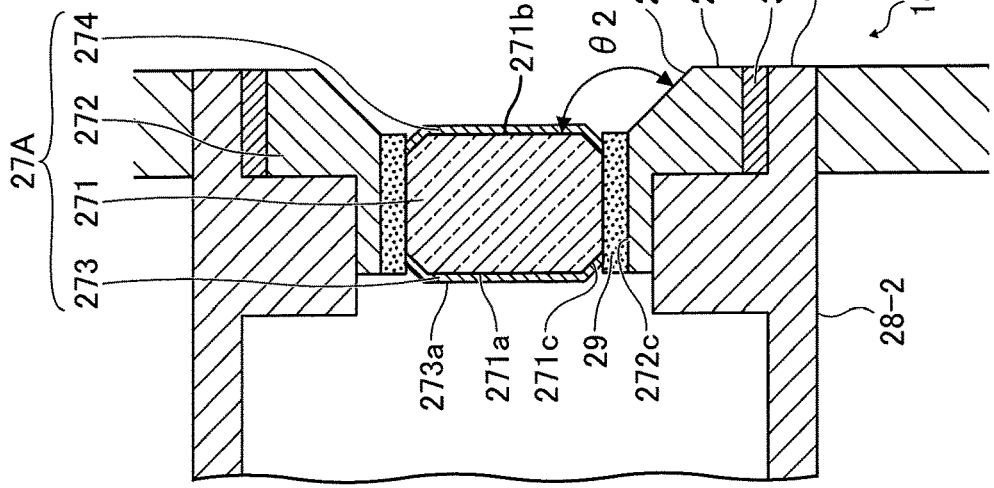
FIG. 6 is a sectional view of another example configuration of a window, according to an embodiment of the present disclosure.

As illustrated in FIG. 6, in the optical window 271 according to the present embodiment, a tapered portion 271c may be formed at the periphery of the incident plane 271a and the exit plane 271b of the optical window 271. Due to this configuration, when the optical window 271 and the optical window holding member 272 are joining together, a brazing material can easily get into the gap therebetween. Note also that the tapered portion 271c is formed in an area through which no laser beam passes. Alternatively, the tapered portion 271c may only be formed on either one of the incident plane 271a or the exit plane 271b.

Figure 7:
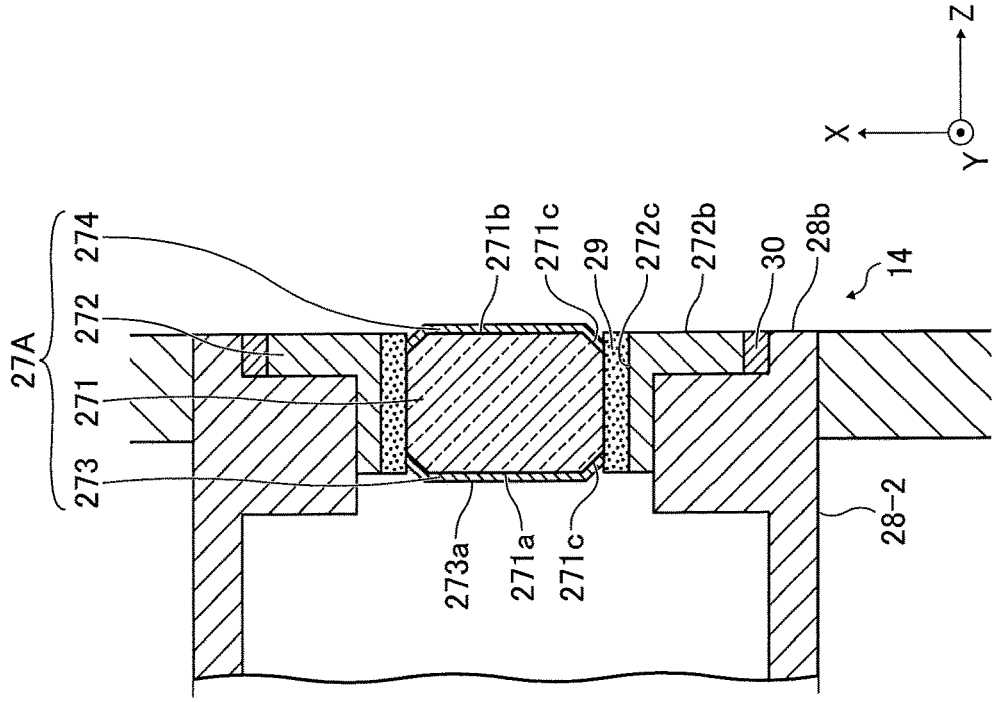
FIG. 7 is a sectional view of another example configuration of a window, according to an embodiment of the present disclosure.

When the tapered portion 271c is formed at the periphery of the incident plane 271a and the exit plane 271b of the optical window 271, as illustrated in FIG. 7, the exit plane 271b of the optical window 271 may be recessed towards the light incident side in the −Z-axis direction with reference to the exit-side end surface 272b of the optical window holding member 272. In such a configuration, the diameter-enlarged portion 272c2 needs to be formed on the inside surface 272c of the optical window holding member 272. The diameter-enlarged portion 272c2, which is a part of the inside surface 272c of the optical window holding member 272 that contacts the exit plane 271b, forms the widest angle with the optical axes of the laser beams. Here, note that the angle θ2 that the diameter-enlarged portion 272c2 forms with the exit plane 271b of the optical window 271 needs to be wider than 90°, and preferably 100° or wider. When the angle θ2 is greater than 90°, the variations in thickness can be reduced in the catalyst layer 274 that is formed on the exit plane 271b. When the angle θ2 is equal to or wider than 1000, the catalyst layer 274 can evenly be formed on the exit plane 271b.

Figure 8:
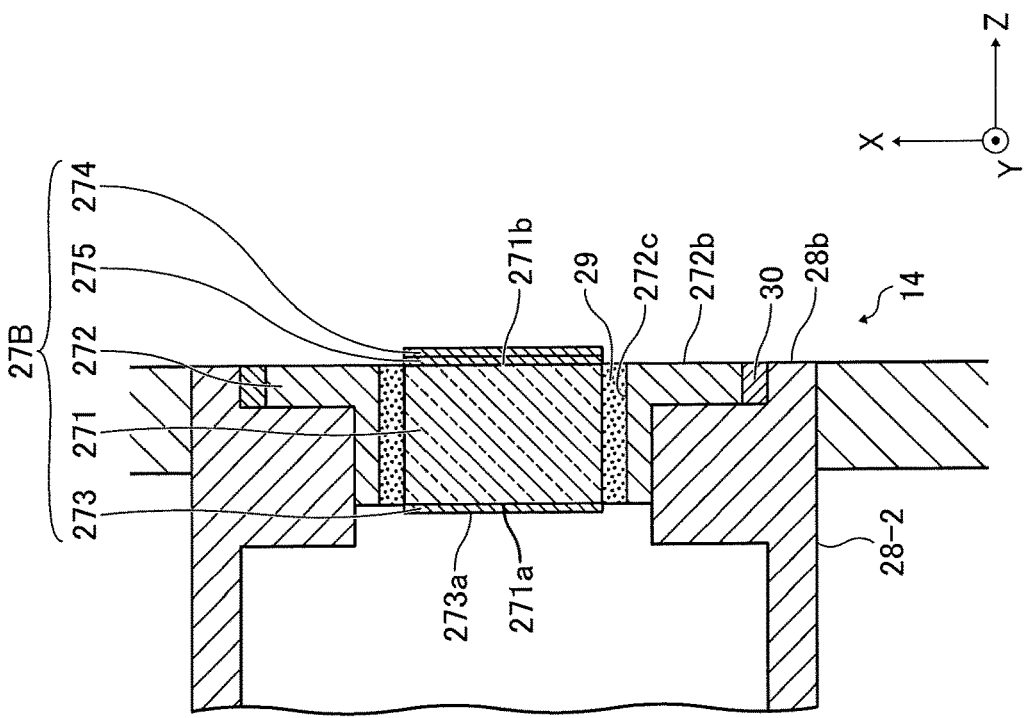
FIG. 8 is a sectional view of another example configuration of a window, according to an embodiment of the present disclosure.

When the exit plane 271b of the optical window 271 is recessed towards the light incident side in the −Z-axis direction with reference to the exit-side end surface 272b of the optical window holding member 272 and the diameter-enlarged portion 272c2 is not formed on the inside surface 272c of the optical window holding member 272, as illustrated in FIG. 8, the angle θ2 becomes 90°. If the angle θ2 is equal to or narrower than 900, the optical window holding member 272 disturbs when the catalyst layer 274 is formed on the optical window 271, and the catalyst layer 274 cannot evenly be formed. Even if the tapered portion 271c is formed on the periphery of the optical window 271, the catalyst layer 274 that is formed near the inside surface 272c of the optical window holding member 272 tends to be bowed outward at the center due to the configuration in which the exit plane 271b is recessed towards the light incident side in the −Z-axis direction with reference to the exit-side end surface 272b of the optical window holding member 272. As a result, the evenness of the catalyst layer 274 that is formed on the exit plane 271b decreases.

In FIG. 6 and FIG. 7, the tapered portion 271c is formed on the periphery of both the incident plane 271a and the exit plane 271b of the optical window 271 through which the laser beams enter and exit, respectively. However, the tapered portion 271c may be formed only on the periphery of either one of the incident plane 271a and the exit plane 271b of the optical window 271.

In the present embodiment, the housing 28 accommodates the second condensing optical system 24, the laser resonator 25, the third condensing optical system 26, and the optical window 271. However, the housing 28 may further accommodate the first condensing optical system 22 and the optical fiber 23.

In the present embodiment, the first housing 28-1 accommodates the second condensing optical system 24 and the laser resonator 25, and the second housing 28-2 accommodates the third condensing optical system 26 and the window 27. However, no limitation is intended thereby. For example, the first housing 28-1 may accommodate only the second condensing optical system 24, and the second housing 28-2 may further accommodate the laser resonator 25. Alternatively, the first housing 28-1 may further accommodate the third condensing optical system 26 in addition to the second condensing optical system 24 and the laser resonator 25, and the second housing 28-2 may accommodate only the window 27.

In the present embodiment as described above, cases in which the surface-emitting laser 21 is used as a pump source are described. However, no limitation is intended thereby, and other kinds of light source may be used.

When it is not necessary to arrange the surface-emitting laser 21 at a position distant from the laser resonator 25 in the present embodiment, the provision of the optical fiber 23 may be omitted.

In the present embodiment, cases in which the laser device 11 is used as an ignition system for the engine 10 that serves as the internal combustion engine and moves upward and downward a piston with flammable gas are described. However, no limitation is intended thereby. The laser device 11 may be used for an engine that burns fuel to produce flammable gas. For example, the laser device 11 may be used for a rotary engine, a gas turbine engine, and a jet engine. Moreover, the laser device 11 may be used for cogeneration that is a system in which exhaust heat is reused to increase the comprehensive energy efficiency. The exhaust heat in cogeneration is used for obtaining motive power, heating energy, or cooling energy.

Furthermore, the laser device 11 may be used as a window for, for example, image forming apparatuses such as a laser copier and a laser printer, image projection devices such as a projector, laser beam machines, laser peening devices, or terahertz (THz) generators.

Second Embodiment

Next, a laser device according to a second embodiment of the present disclosure is described with reference to FIG. 9. Note that like reference signs are given to like elements similar to those described as above in the first embodiment, and their detailed description is omitted. Compared with the laser device according to the first embodiment, the configurations of the present embodiment are similar to those of the first embodiment except the window 27A of the laser device 11, as illustrated in FIG. 2 and FIG. 3. Accordingly, only the configuration of the window according to the present embodiment is described.

Figure 9:
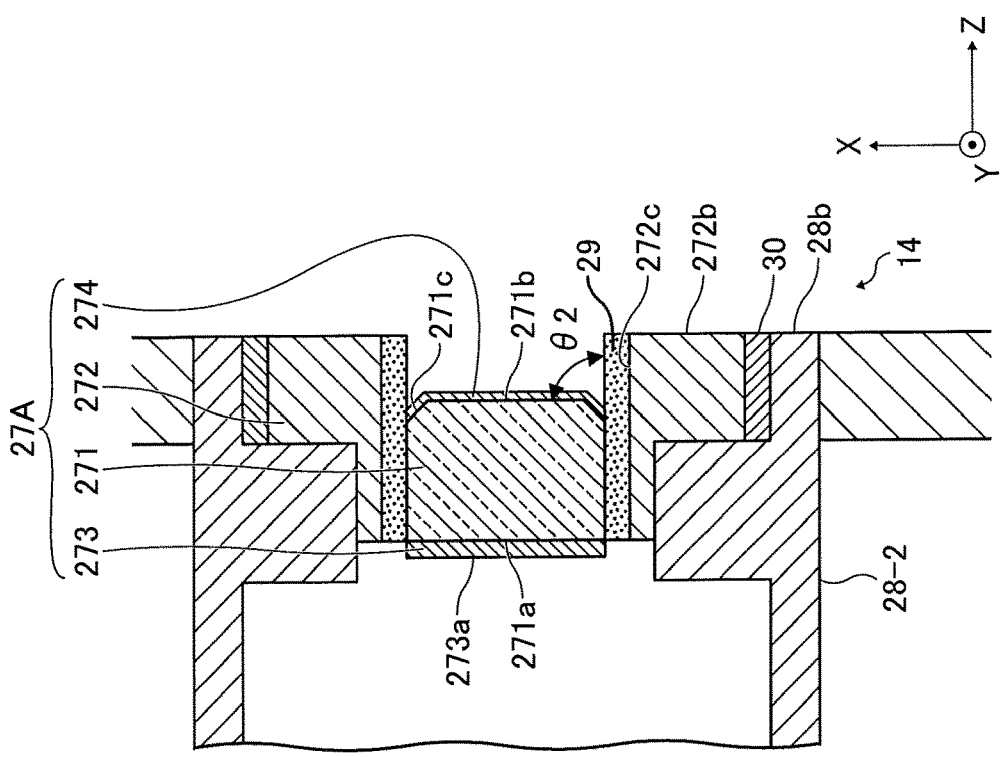
FIG. 9 is a diagram illustrating a configuration of a window of a laser device, according to a second embodiment of the present disclosure.

FIG. 9 is a diagram illustrating a configuration of a window of the laser device, according to the second embodiment of the present disclosure.

As illustrated in FIG. 9, the window 27B is provided with a hydrophilic layer 275 that is formed between the optical window 271 and the catalyst layer 274.

The hydrophilic layer 275 is formed of a material that has an affinity for water. Such a material that has an affinity for water may be, for example, oxides, nitrides, carbides, or fluoride of for example, Si, Al, Ca, Ti, Zr, Ta, and Bi. Among these, it is desired that silicon dioxide ($SiO_2$) that is an oxide of Si be adopted. The hydrophilic layer 275 may be made of one of these materials, or may be made of two or more of these materials in combination.

When the hydrophilic layer 275 is formed on the exit plane 271b of the optical window 271, the maximum value of the thickness of the catalyst layer 274 can further be reduced to a value smaller than 1 m. When the thickness of the catalyst layer 274 is small, as described above, even when the catalyst layer 274 is directly formed on the surface of the optical window 271, the catalyst layer 274 tends to be separated from the optical window 271. In the present embodiment, the hydrophilic layer 275 is formed on the on the exit plane 271b of the optical window 271 in advance. Accordingly, the catalyst layer 274 can be formed on a plane that has a high affinity for water. Due to this configuration, even if the thickness of the catalyst layer 274 is made even thinner, the catalyst layer 274 can stably be formed on the surface of the catalyst layer 274 on the light exiting side.

Note also that the thickness of the hydrophilic layer 275 is not limited to any particular thickness, and it is satisfactory as long as the hydrophilic layer 275 has thickness that enables a high optical transmittance for the laser beams with wavelengths of 1064 nm and maintains the adhesive force with the optical window 271.

As described above, the thickness of the catalyst layer 274 can further be reduced by forming the hydrophilic layer 275 on the exit plane 271b of the optical window 271. Due to this configuration, the transparency of the catalyst layer 274 can further be improved. Accordingly, the transmittance of the laser beams can further be improved, and stains can be prevented from sticking to the optical window 271.

In order to prevent the reflection of the laser beams, it is desired that the two layers composed of the catalyst layer 274 and the hydrophilic layer 275 be adjusted to have appropriate thickness, respectively, in view of the refractive indexes of the catalyst layer 274 and the hydrophilic layer 275. When the two layers that are composed of the catalyst layer 274 and the hydrophilic layer 275 are formed on the optical window 271 on the light exiting side, the reflectance R of the two layers of the catalyst layer 274 and the hydrophilic layer 275 is expressed in Equation 3 given below. Moreover, $d_{AR1}$ that denotes the thickness of the hydrophilic layer 275 is expressed in Equation 4 given below, and $d_AR2$ that denotes the thickness of the catalyst layer 274 is expressed in Equation 5 given below. In these equations, $n_0$ denotes the refractive index of the air ($n_0$=1), and nm denotes the refractive index of the optical window 271. Moreover, $n_{AR1}$ denotes the refractive index of the hydrophilic layer 275, and $n_{AR2}$ denotes the refractive index of the catalyst layer 274. Further, $\lambda$ denotes the wavelengths of the laser beams (1064 nm).

$$R=[(n_0 \times (n_{AR2})^2 - n_m \times (n_{AR1})^2/(n_{AR2})^2 + n_m \times (n_{AR1})^2]^2 \quad \text{[Equation 3]}$$

$$d_{AR1}=\lambda/(4 \times n_{AR1}) \quad \text{[Equation 4]}$$

$$d_{AR2}=\lambda/(4 \times n_{AR2}) \quad \text{[Equation 5]}$$

As understood from the above Equation 3, the difference in refractive index between the catalyst layer 274 and the hydrophilic layer 275 needs to be increased in order to reduce the reflectance R of the two layers composed of the catalyst layer 274 and the hydrophilic layer 275 and achieve high antireflective functionality. For this reason, it is desired that the materials of the catalyst layer 274 and hydrophilic layer 275 be chosen so as to have a large difference in refractive index. In the present embodiment, each of the catalyst layer 274 and the hydrophilic layer 275 is adjusted to have the thickness calculated from the above equations. By so doing, the two layers of the catalyst layer 274 and the hydrophilic layer 275 can achieve high antireflective functionality.

The hydrophilic layer 275 may be formed on the exit plane 271b of the optical window 271, for example, after the optical window 271 is fixed on the inside surfaces of the optical window holding member 272 by brazing and the antireflection film 273 is formed on the plane of the optical window 271 on the incident side. As a method of forming the hydrophilic layer 275 on the optical window 271, for example, vapor deposition, sputtering, thermal spraying (flame plating), coating, or sol-gel processes may be used.

In the present embodiment, the hydrophilic layer 275 has single-layer structure. However, no limitation is intended thereby, and the hydrophilic layer 275 may have multilayer structure.

Third Embodiment

Next, a laser device according to a third embodiment of the present disclosure is described with reference to FIG. 10 to FIG. 26. Note that like reference signs are given to like elements similar to those described as above in the first embodiment, and their detailed description is omitted. Compared with the laser device according to the first embodiment, the configurations of the present embodiment are similar to those of the first embodiment except the window 27A of the laser device 11, as illustrated in FIG. 2 and FIG. 3. Accordingly, only the configuration of the window according to the present embodiment is described.

Figure 10:
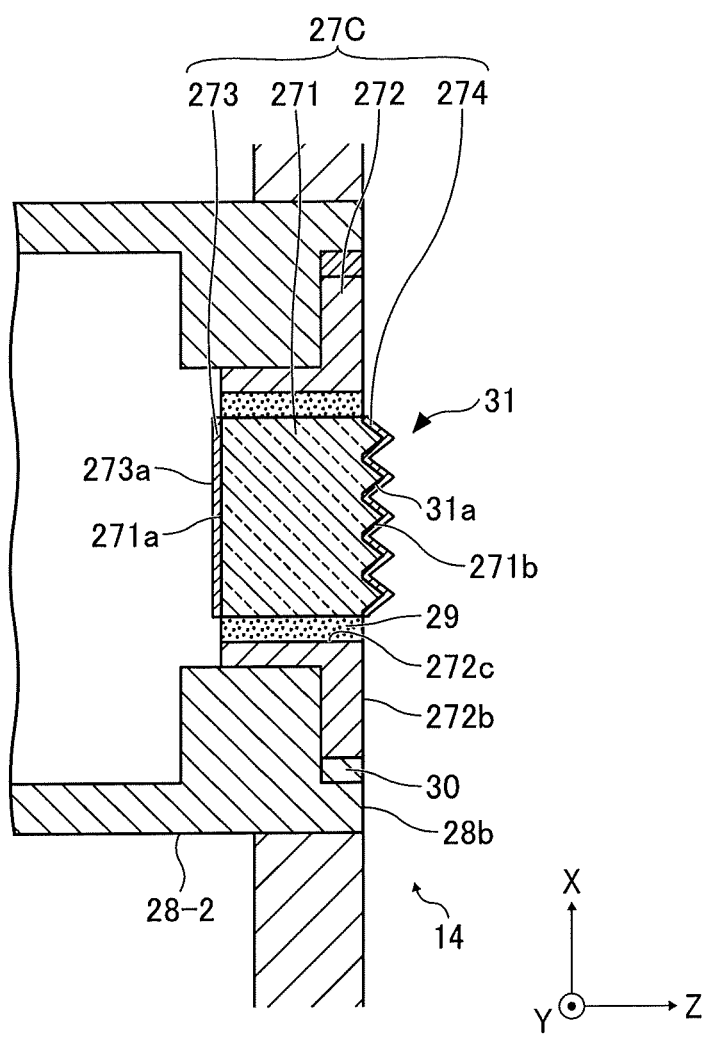
FIG. 10 is a diagram illustrating a configuration of a window of a laser device, according to a third embodiment of the present disclosure.

FIG. 10 is a diagram illustrating a configuration of a window of a laser device, according to the third embodiment of the present disclosure.

Figure 11:
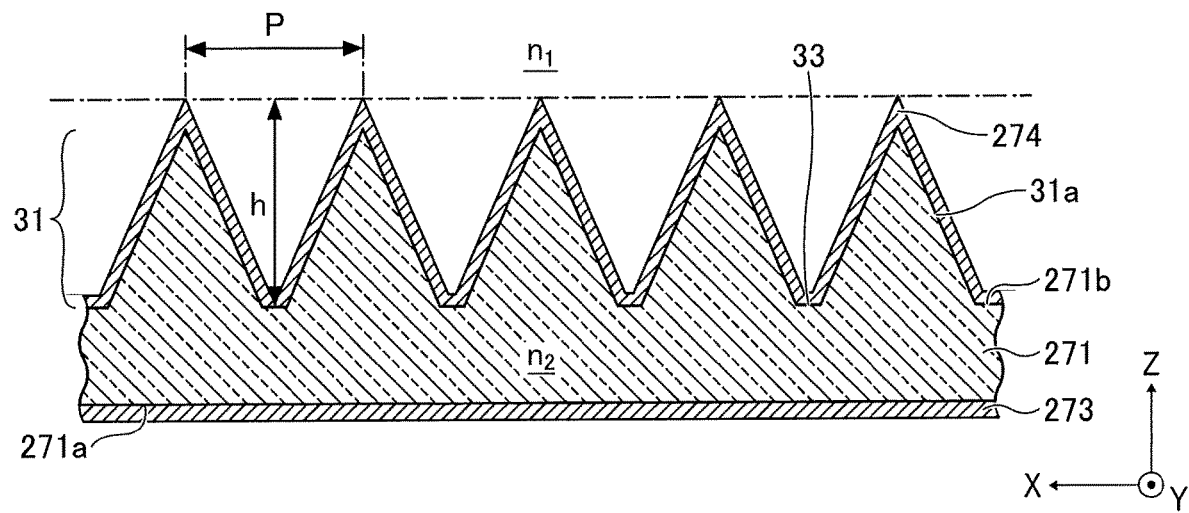
FIG. 11 is a partially magnified view of a window according to an embodiment of the present disclosure.

FIG. 11 is a partially magnified view of the window illustrated in FIG. 10.

As illustrated in FIG. 10 and FIG. 11, the window 27C has a microstructure division 31 on the exit plane 271b of the optical window 271, and the catalyst layer 274 is formed on the surfaces of the microstructure division 31. The microstructure division 31 includes a plurality of convex micro parts (hereinafter, such a plurality of convex micro parts will be referred to as "micro-convex parts") 31a.

The micro-convex parts 31a are cone-shaped (tapered) where the cross-sectional areas of the micro-convex parts 31a gradually decrease in the +Z-direction. More specifically, the cross-sectional areas of the micro-convex parts 31a gradually decrease from the light entering side (incident side) to the light exiting side of the window 27C. Due to this configuration, the changes in refractive index on the interface between the window 27C and the combustion chamber 14 can be minimized, and thus the reflection of the laser beams on the interface can be controlled.

The multiple micro-convex parts 31a are arranged with a pitch P shorter than the wavelength of incident laser beams (incident light) (for example, 1064 nanometers (nm)). More specifically, the vertices of the micro-convex parts 31a arranged with a pitch shorter than the wavelength of incident laser beams. In the present embodiment, it is assumed that the spaces between the multiple micro-convex parts 31a are the spaces between the vertices of a neighboring pair of the micro-convex parts 31a. However, no limitation is indicated thereby, and the spaces between the multiple micro-convex parts 31a may be the distance between the centers of the bases of the neighboring pair of the micro-convex parts 31a.

The diameters of the micro-convex parts 31a and the pitches P of the micro-convex parts 31a are satisfactory as long as they are shorter than the wavelengths of the laser beams in order to reduce the reflectance of the laser beams. It is desired that the diameters of the micro-convex parts 31a be equal to or shorter than the half of the wavelengths of the laser beams, and it is more desirable if the diameters of the micro-convex parts 31a are within range of 5 nanometers (nm) to 1000 nm. As long as the diameters of the micro-convex parts 31a are within range of 5 nm to 1000 nm, the reflectance of the laser beams can sufficiently be reduced.

It is desired that the pitch P of the multiple micro-convex parts 31a be equal to or shorter than the half of the wavelengths of the laser beams, and it is more desirable if the pitch P of the multiple micro-convex parts 31a are within range of 10 nm to 2000 nm. As long as the space of the multiple micro-convex parts 31a are within range of 10 nm to 1000 nm, the reflectance of the laser beams can sufficiently be reduced.

Moreover, it is desired that a flat surface 33 be formed between a neighboring pair of the micro-convex parts 31a. More specifically, the areas of the flat surfaces 33 are expected to be, for example, 30% to 60% of the entire area of the microstructure division 31.

Figure 12:
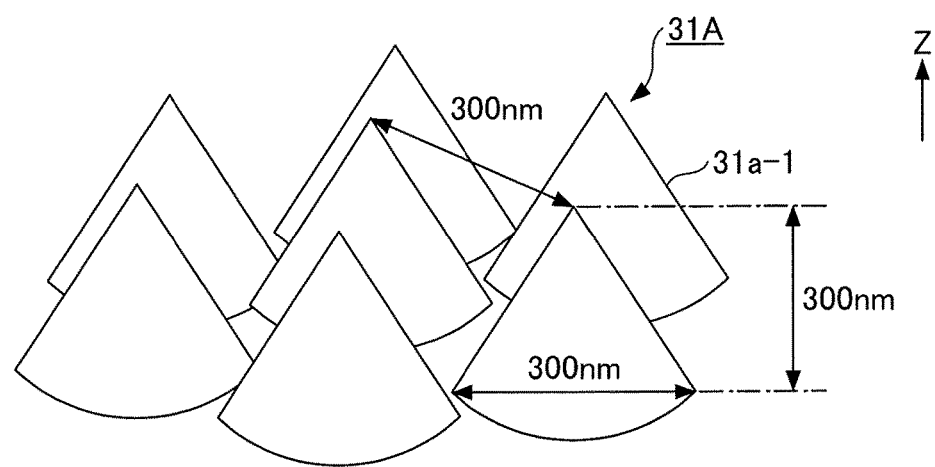
FIG. 12 is a diagram illustrating an example of a microstructure division, according to an embodiment of the present disclosure.

Next, examples of the tapered micro-convex parts 31a are described with reference to FIG. 12, FIG. 13, and FIG. 14. As illustrated in FIG. 12, in a microstructure division 31A, cone-shaped micro-convex parts 31a-1 whose heights are about 300 nm and the diameters of the bases are about 300 nm are arranged in a staggered manner at intervals of about 300 nm. In other words, the micro-convex parts 31a-1 are arranged such that the spaces between the vertices or the distances between the centers of the bottom are about 300 nm.

Figure 13:
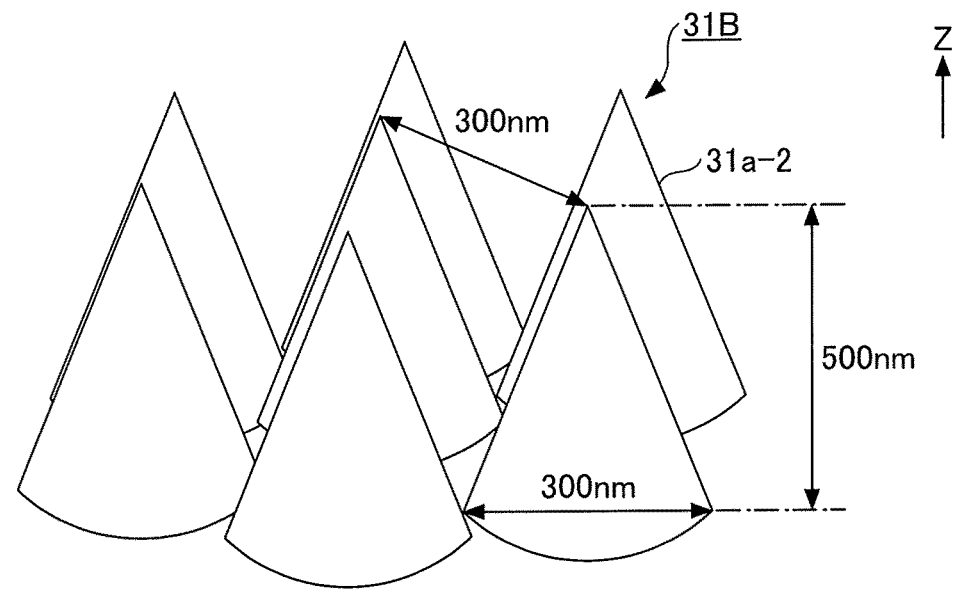
FIG. 13 is a diagram illustrating another example of a microstructure division, according to an embodiment of the present disclosure.

As illustrated in FIG. 13, in a microstructure division 31B, cone-shaped micro-convex parts 31a-2 whose heights are about 500 nm and the diameters of the bases are about 300 nm are arranged in a staggered manner at intervals of about 300 nm. Compared with the micro-convex parts 31a-1, the micro-convex parts 31a-2 has a high aspect ratio where the ratio of the height to the maximum diameter is high. Due to this configuration, the micro-convex parts 31a-2 can make the changes in the refractive index of the laser beams gentler. Accordingly, the reflectance of the laser beams can further be reduced.

Figure 14:
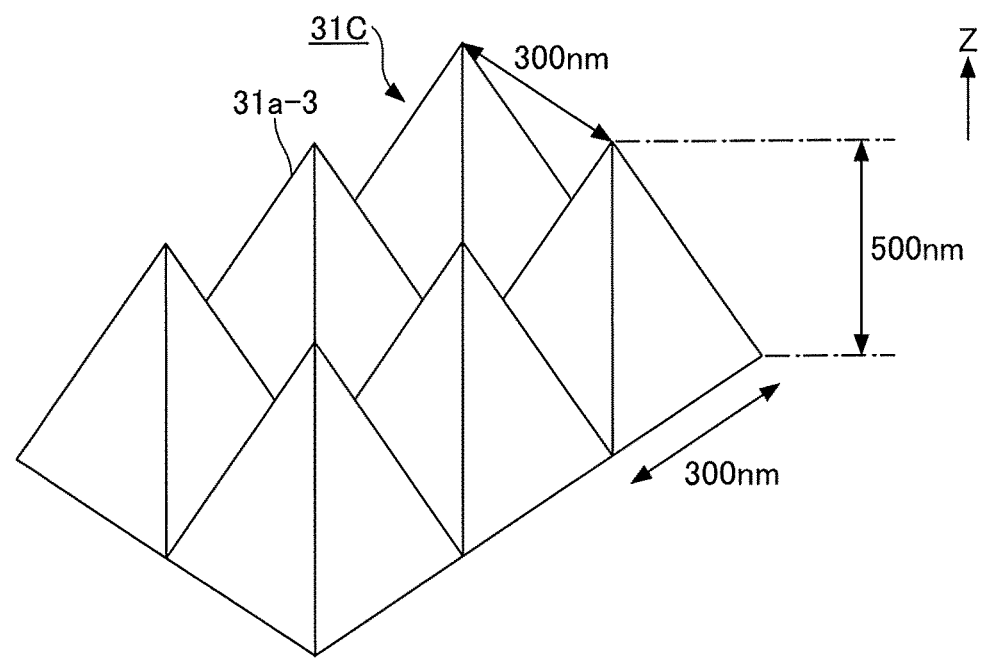
FIG. 14 is a diagram illustrating another example of a microstructure division, according to an embodiment of the present disclosure.

As illustrated in FIG. 14, in a microstructure division 31C, micro-convex parts 31a-3 each of which is shaped like a quadrangular pyramid having a square base are arranged in a grid pattern. Moreover, the heights of the micro-convex parts 31a-3 are 500 nm and the sides of the bottoms of the micro-convex parts 31a-3 are 300 nm. In the microstructure division 31C, there is no space between the multiple micro-convex parts 31a-3, and the changes in refractive index ($n_2$->$n_k$ (>$n_1$)) can reliably be reduced. For this reason, the reflectance of the incident light on the interface can be decreased to a degree less than that of the microstructure division 31A and the microstructure division 31B as above.

Figure 15:
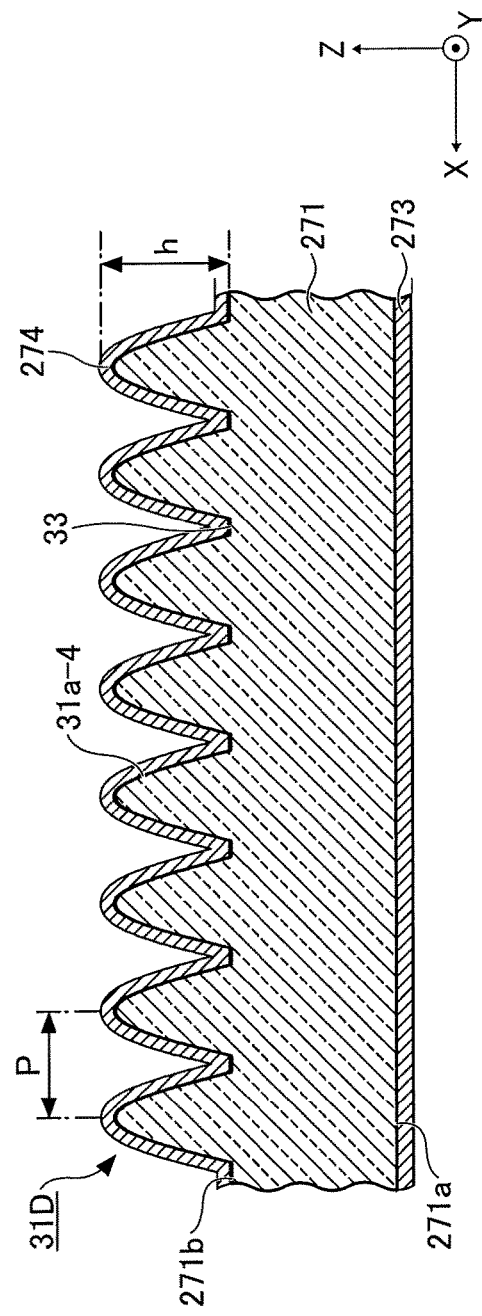
FIG. 15 is a diagram illustrating a modification of a microstructure division according to an embodiment of the present disclosure.
Figure 16:
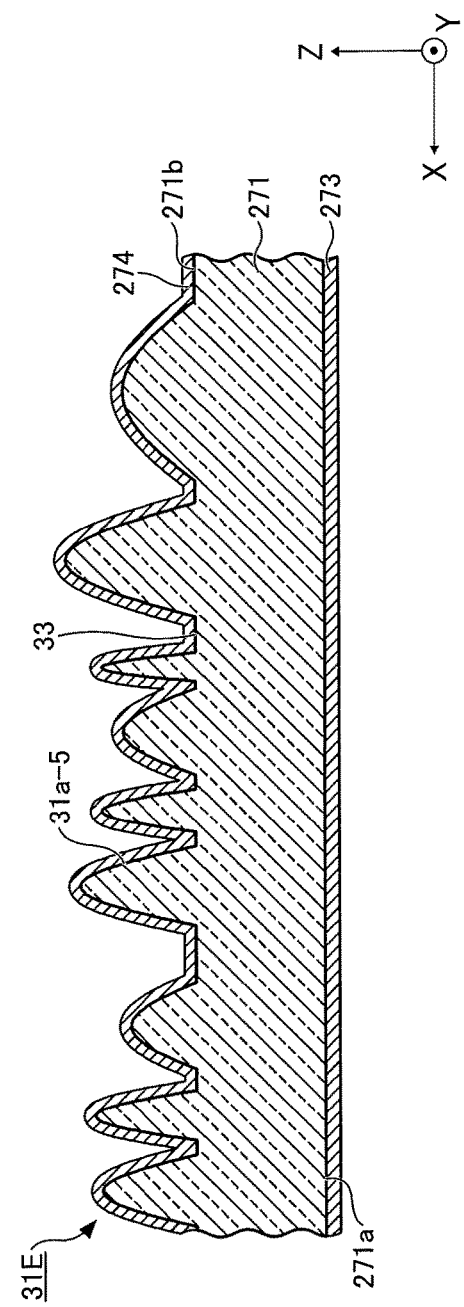
FIG. 16 is a diagram illustrating another modification of a microstructure division according to an embodiment of the present disclosure.

As illustrated in FIG. 15, the micro-convex parts 31a may be shaped like a hanging bell. Alternatively, as illustrated in FIG. 16, the spaces between a neighboring pair of the micro-convex parts 31a may be irregular. For the sake of explanatory convenience, the microstructure division and the micro-convex parts illustrated in FIG. 15 are referred to as a microstructure division 31D and micro-convex parts 31a-4, respectively. In a similar manner, the microstructure division and the micro-convex parts illustrated in FIG. 16 are referred to as a microstructure division 31E and micro-convex parts 31a-5, respectively.

Figure 17:
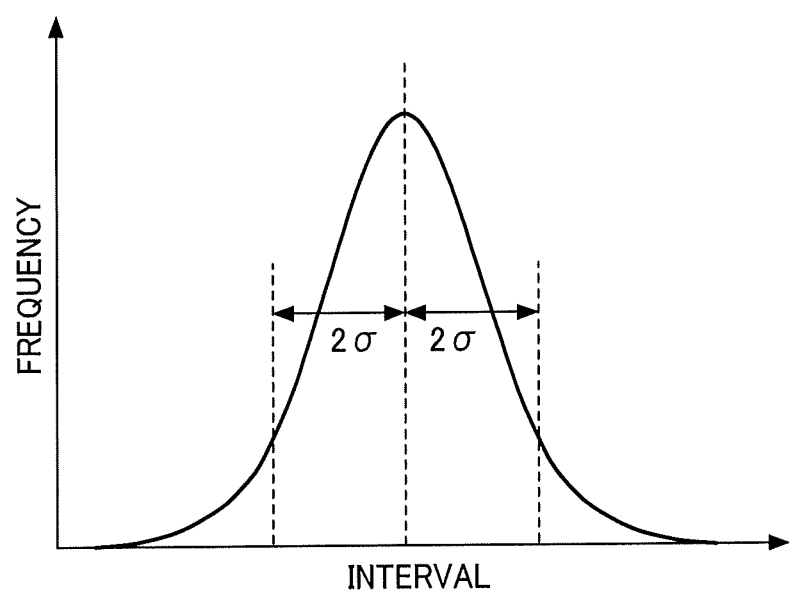
FIG. 17 is a diagram illustrating a Gaussian distribution according to an example embodiment of the present invention.

Even when the spaces between a neighboring pair of the micro-convex parts 31a are irregular, it is desired that the average space between a neighboring pair of the micro-convex parts 31a in the microstructure division 31 be equal to or shorter than the half of the wavelengths of the incident light. Moreover, it is desired that the space between a neighboring pair of the micro-convex parts 31a in the microstructure division 31 be in accordance with the Gaussian distribution. When the space is in accordance with the Gaussian distribution, as illustrated in FIG. 17, the value of 2 σ in the Gaussian distribution is equal to or smaller than the wavelength multiplied by $1/\sqrt{2}$.

The microstructure divisions 31A to 31C are often manufactured by the electron-beam lithography and etching, and the microstructure division 31D and the microstructure division 31E are often manufactured by etching processes where metallic nanoparticles are used as a mask. Alternatively, the microstructure division 31D and the microstructure division 31E may be manufactured using, for example, X-ray lithography and photolithography.

Next, the area of the microstructure division 31 (the area of the microstructure division) that is arranged on the exit plane 271b of the window 27C is described.

Figure 18:
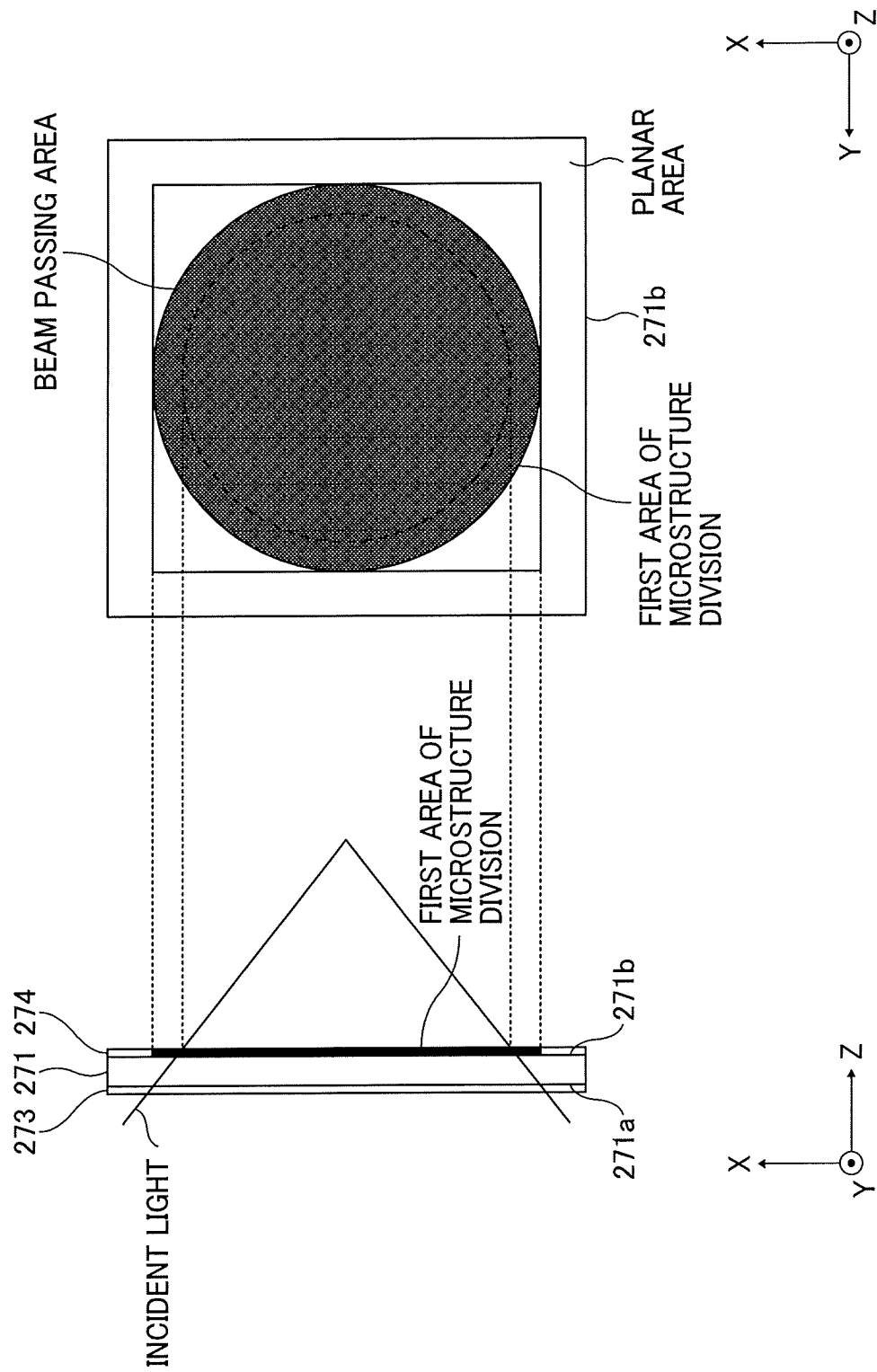
FIG. 18 is a diagram illustrating a first area of a microstructure division, according to an embodiment of the present disclosure.

As illustrated in FIG. 18, the first area of the microstructure division is the area inside the planar area shaped like a rectangular frame joined to the housing 28 on the exit plane 271b, and includes the beam passing area of the exit plane 271b. Due to such a configuration, all the laser beams that pass through the exit plane 271b are incident on the first area of the microstructure division, and the reflectance of all the laser beams is reduced. Note also that even when the positions of the exit plane 271b through which the laser beams pass are slightly misaligned, the reflectance of all the laser beams is still reduced.

Figure 19:
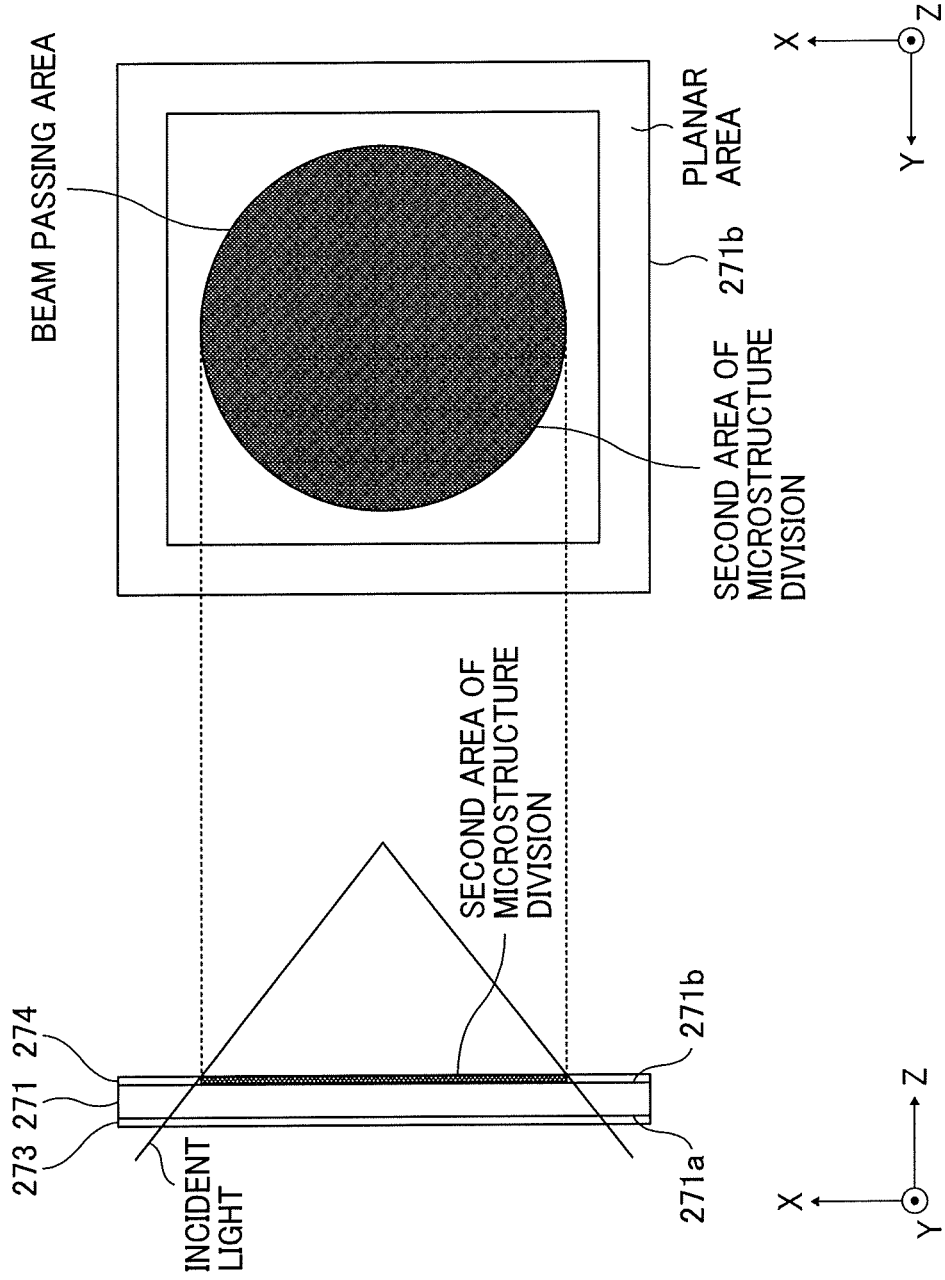
FIG. 19 is a diagram illustrating a second area of a microstructure division, according to an embodiment of the present disclosure.

As illustrated in FIG. 19, the second area of the microstructure division matches the beam passing area of the exit plane 271b. Due to such a configuration, all the laser beams that pass through the exit plane 271b are incident on the second area of the microstructure division, and the reflectance of all the laser beams is reduced. In this configuration, the microstructure division 31 is formed only to the area of the exit plane 271b through which the laser beams pass, and thus the area to be processed can be narrowed.

Figure 20:
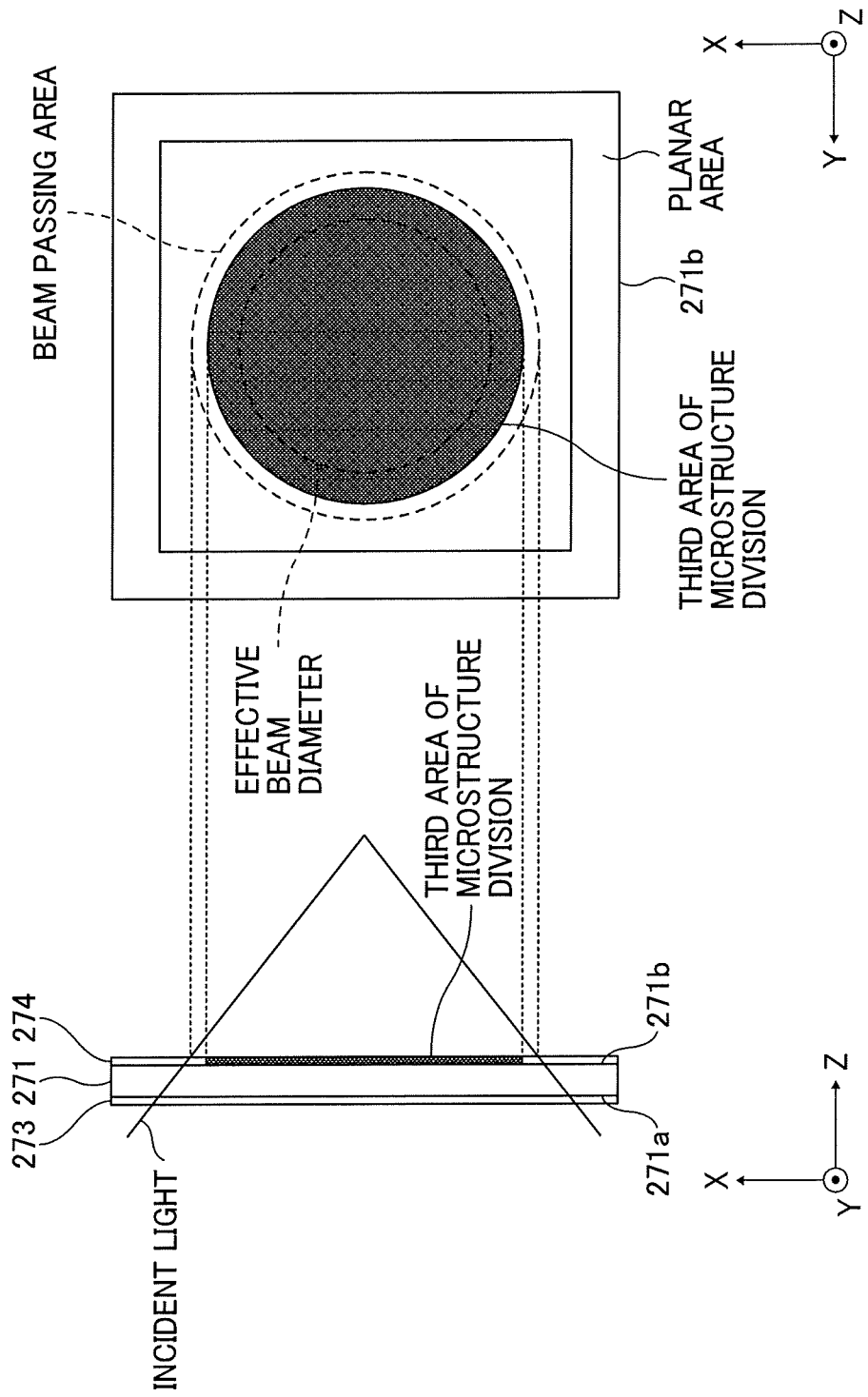
FIG. 20 is a diagram illustrating a third area of a microstructure division, according to an embodiment of the present disclosure.
Figure 21:
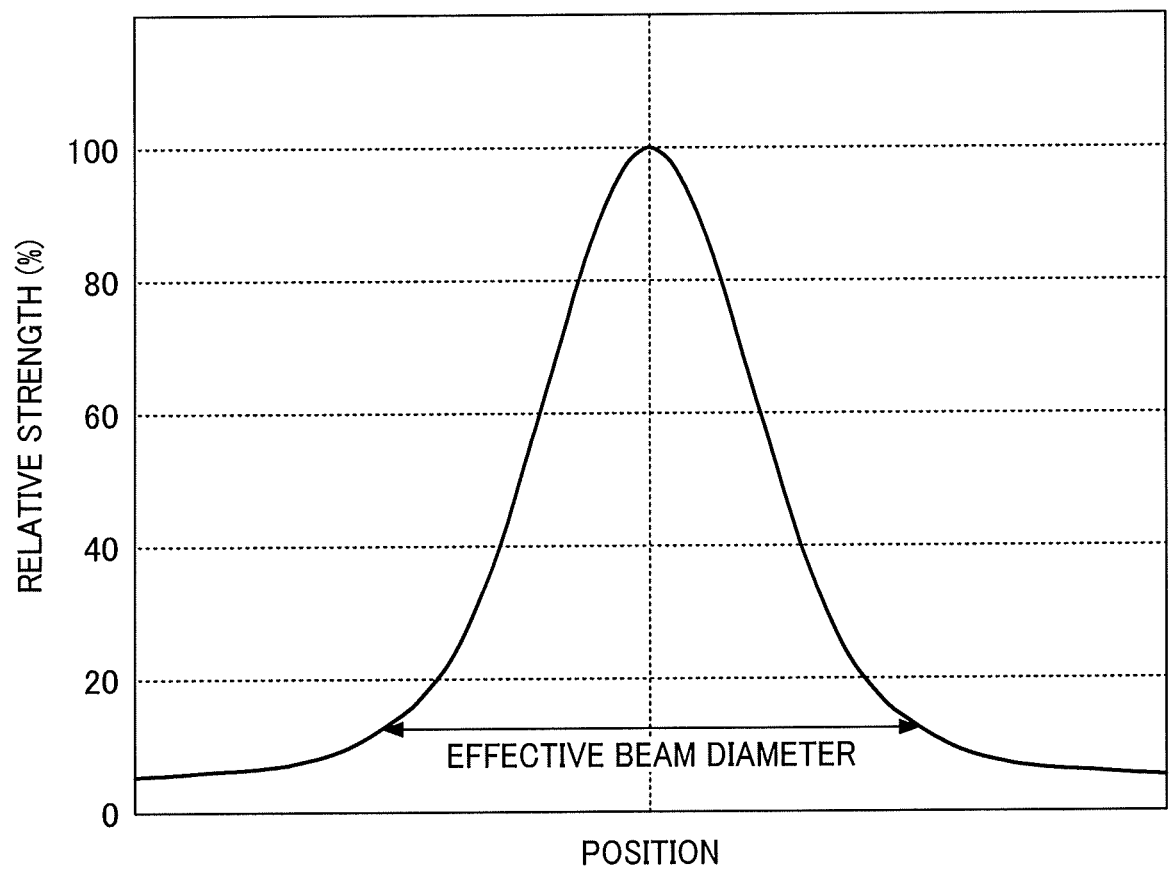
FIG. 21 is a diagram illustrating an effective beam diameter, according to an embodiment of the present disclosure.

As illustrated in FIG. 20, the third area of the microstructure division is included within the beam passing area of the exit plane 271b, and includes an area on the exit plane 271b where the effective beam diameter is the maximum diameter. The term "effective beam diameter" refers to a beam diameter having a relative intensity of $1/e^2$ (13.5%) relative to the maximum intensity (100%) in the Gaussian distribution of light intensity as illustrated in FIG. 21.

In such a configuration, the laser beams pass through the exit plane 271b, and all the laser beams within the area where the effective beam diameter, which has a substantial impact on changes in the intensity of the laser beams that are emitted from the surface-emitting laser 21, is the maximum diameter are incident on the third area of the microstructure division. Accordingly, the reflectance of all the laser beams is reduced. Note also that even when the positions of the exit plane 271b through which the laser beams pass are slightly misaligned, the reflectance of all the laser beams is reduced within the area where the effective beam diameter is the maximum diameter. Moreover, the microstructure division 31 is formed only to the area of the exit plane 271b through which the laser beams, which has a substantial impact on changes in the intensity of the laser beams, pass, and thus the area to be processed can further be narrowed.

Figure 22:
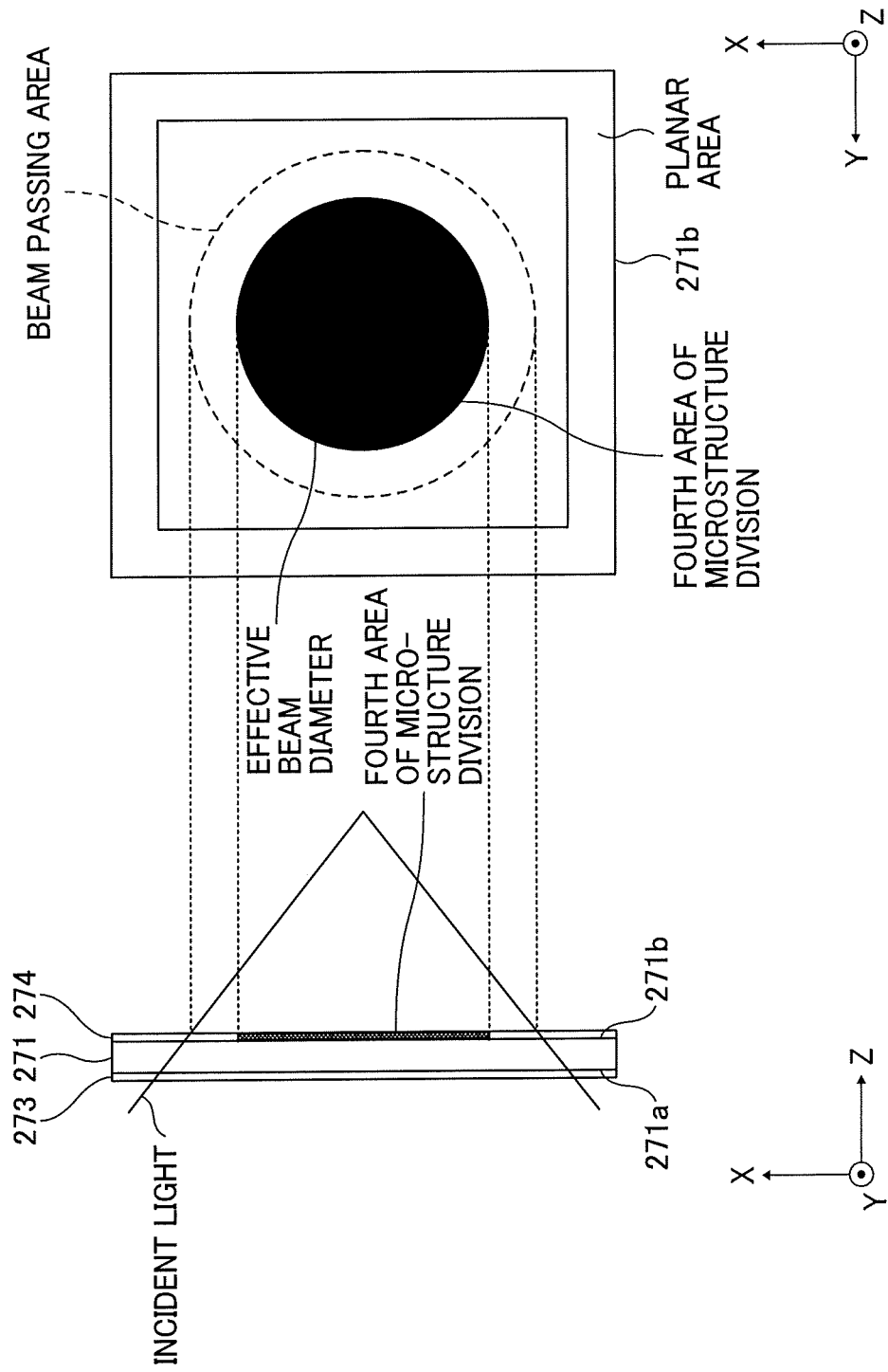
FIG. 22 is a diagram illustrating a fourth area of a microstructure division, according to an embodiment of the present disclosure.

As illustrated in FIG. 22, the fourth area of the microstructure division matches the area on the exit plane 271b where the effective beam diameter is the maximum diameter. In such a configuration, the laser beams pass through the exit plane 271b, and all the laser beams within the effective beam diameter, which has a substantial impact on changes in the intensity of the laser beams that are emitted from the surface-emitting laser 21, are incident on the fourth area of the microstructure division. Accordingly, the reflectance of all the laser beams is reduced. Moreover, it is satisfactory as long as the micro-convex parts 31a-4 are formed only within the area where the effective beam diameter is the maximum diameter. Accordingly, the area to be processed can further be narrowed.

Figure 23:
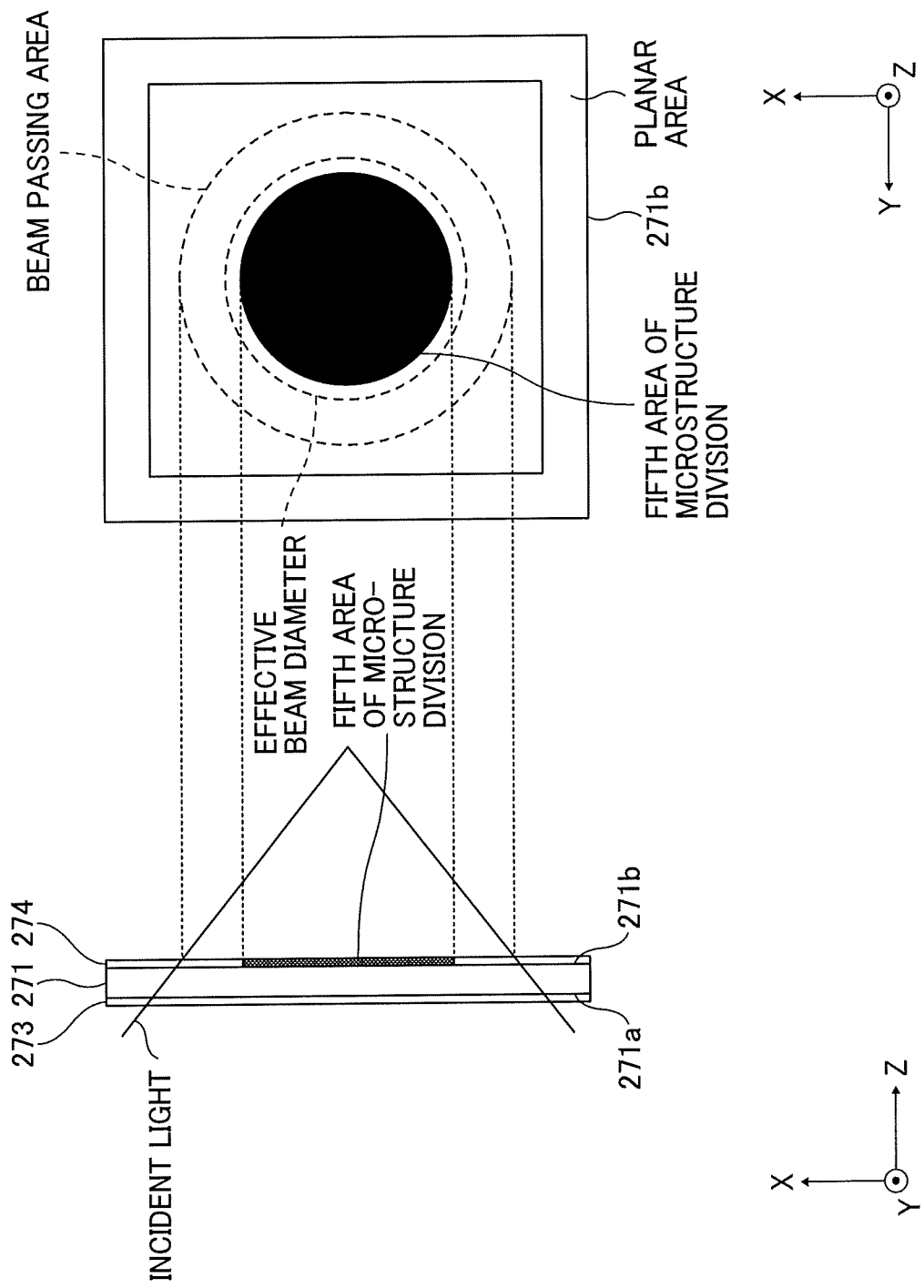
FIG. 23 is a diagram illustrating a fifth area of a microstructure division, according to an embodiment of the present disclosure.

As illustrated in FIG. 23, the fifth area of the microstructure division is included in the area on the exit plane 271b where the effective beam diameter is the maximum diameter, and includes the center of the area on the exit plane 271b where the effective beam diameter is the maximum diameter. In such a configuration, when the laser beams pass through the exit plane 271b, some of the laser beams pass through the area where the effective beam diameter is the maximum diameter. Such some of the laser beams are laser beams with high intensities and includes the laser beams with the maximum intensity, and the intensities tend to fluctuate widely depending on the surface-emitting laser 21. Some of the laser beams are incident on the fifth area of the microstructure division, and the reflectance of such some of the laser beams is reduced. Moreover, it is satisfactory as long as the micro-convex parts 31a-5 are formed only within an area smaller than the area where the effective beam diameter is the maximum diameter. Accordingly, the area to be processed can further be narrowed.

In the present embodiment, the area of the microstructure division is configured to be one of the above first to fifth areas of the microstructure division.

As described above, the window 27C according to the present embodiment has a microstructure division 31 on the exit plane 271b of the optical window 271, and thus the reflection of the laser beams on the exit plane 271b of the window 27C can be controlled. Further, the adhesion of stain can also be prevented.

Next, advantageous effects of the microstructure division 31 are described below in detail.

Figure 24:
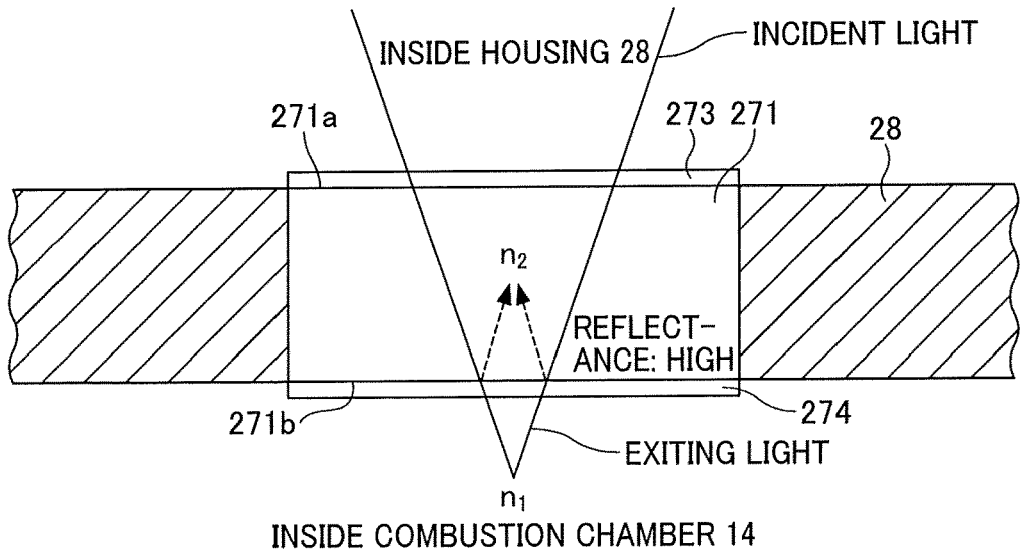
FIG. 24 is a diagram illustrating the reflection of laser beams at a window, according to the related art.

As illustrated in FIG. 24, in known windows where the microstructure division 31 is not formed on the optical window 271, the changes in refractive index ($n_2$->$n_1$) is abrupt on the interface between the optical window 271 and the atmosphere inside the combustion chamber 14. In FIG. 24, $n_2$ denotes the refractive index of the optical window 271, and $n_1$ denotes the refractive index of the atmosphere of the combustion chamber 14. Due to such a configuration as above, the reflectance of the incident laser beams on the interface increases.

Accordingly, in the known windows, some of the laser beams that are incident on the above interface may be reflected and concentrated within the window. Due to this configuration, the optical window 271 may deteriorate, or soot or the like generated in the combustion chamber 14 may stick to the window. As some of the laser beams that are incident on the optical window 271 are reflected and return to the laser medium 251 or the surface-emitting laser 21, the intensity of the laser beams that are emitted from the laser device 11 may fluctuate. Moreover, soot or the like generated in the combustion chamber 14 may stick to the optical window 271, and the light quantity of laser beams that enter the combustion chamber 14 may also decrease.

In the known windows, an antireflection film is formed on the window in order to reduce the reflection of some of the laser beams that are incident on the window. However, the window is arranged facing towards the combustion chamber in the ignition systems. For this reason, the antireflection film may deteriorate as exposed to high temperature (for example, about 600° C.). Accordingly, the functionality of the exit plane 271b as an antireflection film may substantially be lost.

Figure 25:
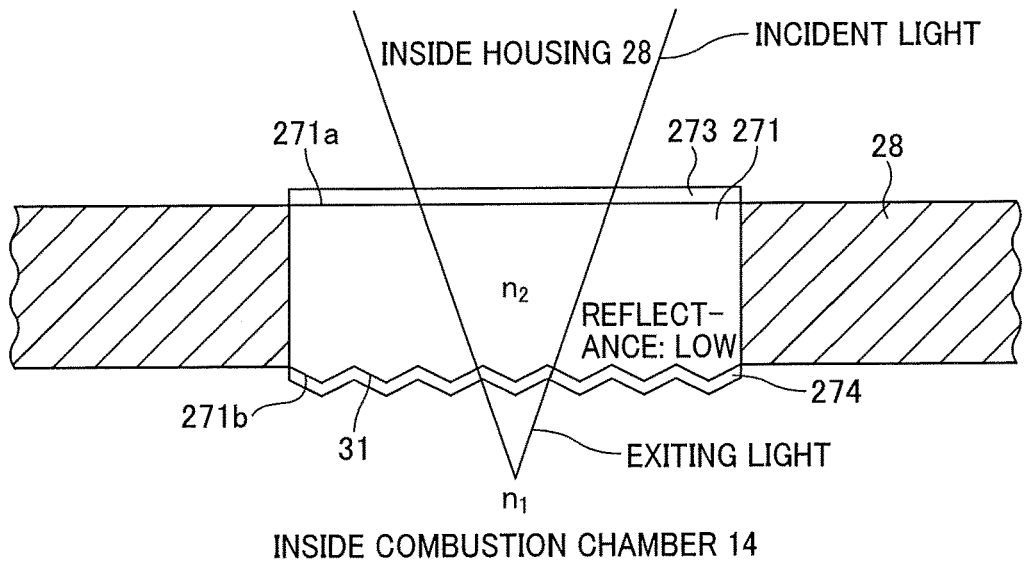
FIG. 25 is a diagram illustrating the reflection of laser beams at a window, according an embodiments of the present disclosure.
Figure 26:
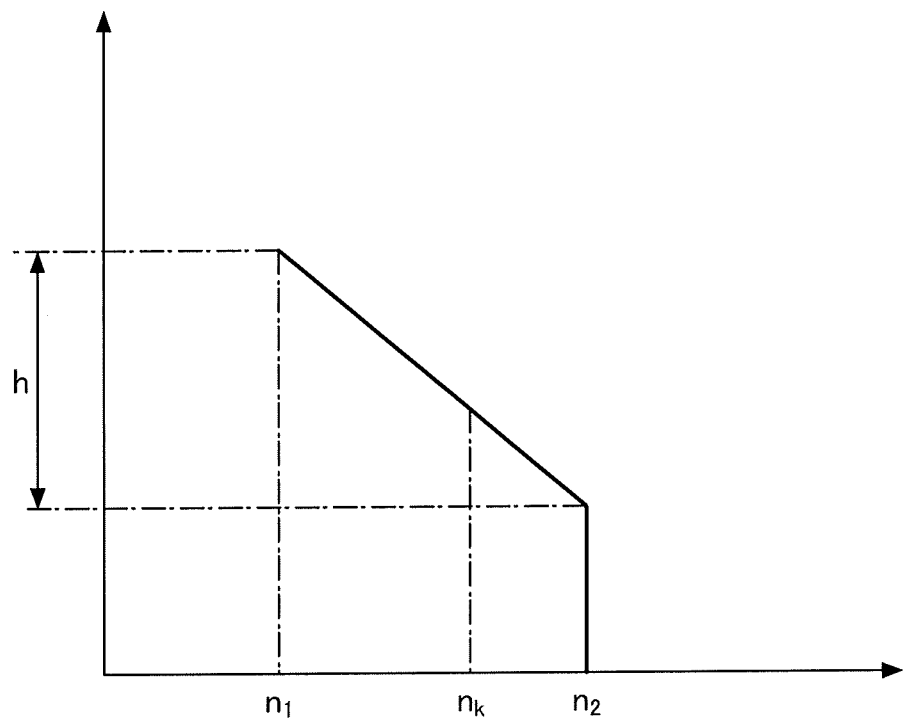
FIG. 26 is a diagram illustrating a reduction effect in amount of laser beams to be reflected at a window, according to an embodiment of the present disclosure.

By contrast, the window 27C according to the present embodiment has the microstructure division 31 that are provided with the multiple micro-convex parts 31a on the exit plane 271b of the window 27C at intervals shorter than the wavelength of incident laser beams (incident light). More specifically, the micro-convex parts 31a are tapered where the cross-sectional areas of the micro-convex parts 31a gradually decrease, and the cross-sectional areas of the micro-convex parts 31a gradually decrease from the light entering side (incident side) to the light exiting side of the window 27C. Due to this configuration, as illustrated in FIG. 25 and FIG. 26, the refractive index can continuously be changed in such a manner that the changes in refractive index on the interface between the window 27C and the combustion chamber 14 ($n_2$->$n_k$ (>$n_1$)) are gentle. Accordingly, the reflectance of the laser beams on the interface can be reduced, and thus the reflectance of the laser beams on the interface can be decreased. When the length of the micro-convex parts 31a in the convex direction is longer than the maximum diameter, the changes in refractive index can be made even gentler, and the reflectance of the laser beams can further be reduced.

Due to this configuration of the present embodiment, the transmittance can be prevented from decreasing as the laser beams are concentrated inside the window 27C and the window 27C deteriorates, or the laser beams can be prevented from returning to the laser medium 251 or the surface-emitting laser 21. Due to this configuration, the intensity of the laser beams can be prevented from fluctuating.

Due to the microstructure division 31, soot or the like generated in the combustion chamber 14 does not easily get into the spaces between the multiple micro-convex parts 31a. Due to this configuration, the adherence of soot or the like to the multiple micro-convex parts 31a can be weakened. Accordingly, the adherence of soot or the like to the microstructure division 31 can be controlled. In the window 27C, while controlling the adherence of soot or the like due to the microstructure division 31, the soot or the like, which is stuck to the surface of the catalyst layer 274 arranged on the light exiting side of the microstructure division 31, can be decomposed. As a result, the window 27C can further efficiently be prevented from being contaminated. As a result, the transmittance of the laser beams that are emitted from the third condensing optical system 26 can be maintained with high stability, and variations in intensity of the laser beams can further be prevented or reduced. Accordingly, the light quantity of laser beams that enter the combustion chamber 14 can be maintained with further improved stability.

In the present embodiment, the optical window 271 is formed of a material with high heat resistance and high pressure resistance. For this reason, even if the microstructure division 31 is disposed at a position where the microstructure division 31 is exposed to the combustion chamber 14, the microstructure division 31 does not deform. For this reason, the reflection of the laser beams on the exit plane 271b can be controlled with high stability in the window 27C according to the present embodiment, compared with when the microstructure division 31 is not formed.

Moreover, it is desired that in the window 27C the spaces between the center points of the multiple micro-convex parts 31a be approximately even. Due to this configuration, in the window 27C, the reflectance can nearly uniformly be reduced throughout the entire area where the micro-convex parts 31a are formed.

As described above, the laser device 11 according to the present embodiment is provided with the window 27C. Due to this configuration, the reflection of the laser beams on the antireflection film 273 and the optical window 271 can be controlled. For this reason, with the laser device 11 according to the present embodiment, a reduction in the light quantity of laser beams that enter the combustion chamber 14 can further be controlled with increased stability.

As long as the micro-convex parts 31a that are formed on the window 27C has convex structure where the micro-convex parts 31a (for example, the vertices of the micro-convex parts 31a) are arranged at intervals shorter than the wavelengths of incident light, the shape, size, and the layout of the micro-convex parts 31a is not limited.

In the present embodiment, cases in which the micro-convex parts 31a is cone-shaped are described. However, no limitation is intended thereby. For example, the micro-convex parts 31a may be tapered and cone-shaped like an elliptical cone, a circular truncated cone, an elliptical truncated cone, a polygonal truncated cone, or tapered and pyramid-shaped like any polygonal pyramid other than a square pyramid. Alternatively, the micro-convex parts 31a may be shaped like, for example, a circular cylinder, an elliptical cylinder, and a polygonal cylinder.

In some embodiments, the vertical cross sections of the micro-convex parts 31a (i.e., the cross section parallel to the light exit direction) may be curved on the sides.

In the present embodiment, the micro-convex parts 31a are tapered, and the cross-sectional areas of the micro-convex parts 31a gradually decrease in the light exit direction. However, no limitation is intended thereby, and the micro-convex parts 31a may have a shape where the cross-sectional area decreases step-by-step in the light exit direction.

In the present embodiment, the multiple micro-convex parts 31a have the same shape and the same size. However, no limitation is intended thereby, and in some embodiments, the shapes or sizes of the multiple micro-convex parts 31a may be different from each other.

In the present embodiment, the multiple micro-convex parts 31a of the microstructure division 31 are regularly arranged. However, as long as the spaces between the multiple micro-convex parts 31a are shorter than the wavelengths of incident light, the spaces between the multiple micro-convex parts 31a are not necessarily regularly arranged.

Next, some modifications of the microstructure division 31 according to the above embodiments of the present disclosure are described.

Figure 27:
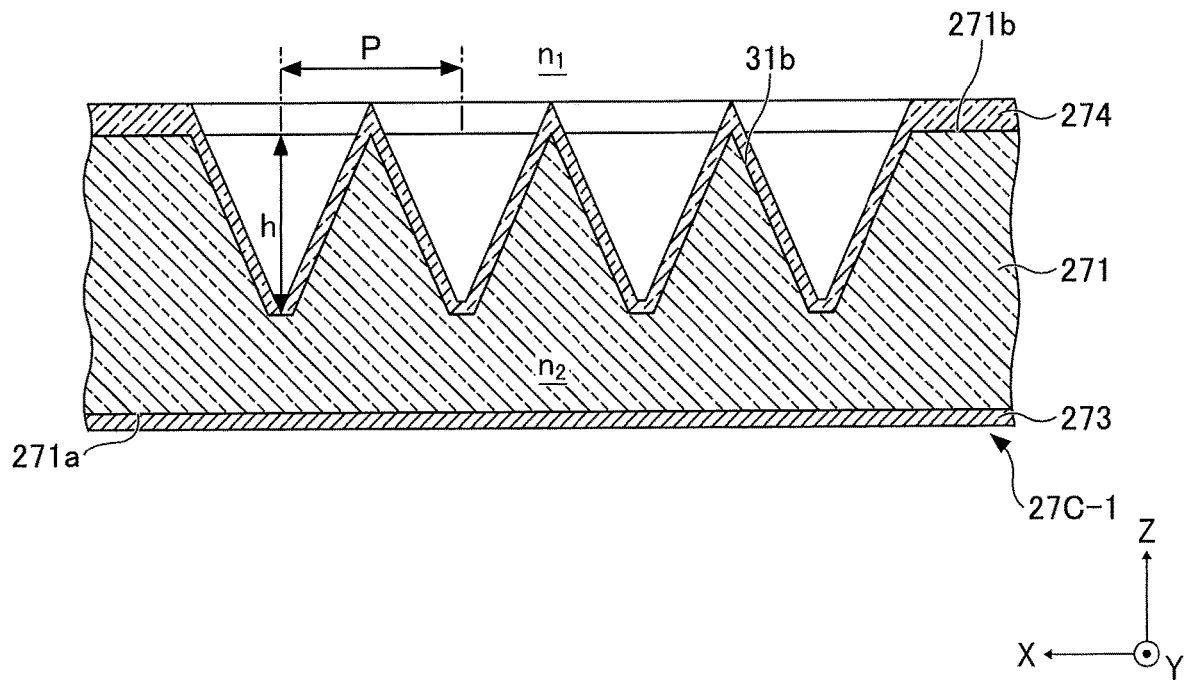
FIG. 27 is a diagram illustrating a first modification of a window according to an embodiment of the present invention.

FIG. 27 is a diagram illustrating a first modification of the window according to the above embodiments of the present disclosure.

A window 27C-1 according to the first modification is illustrated in FIG. 27, and as in the window 27C-1, a plurality of concave micro parts (hereinafter, such a plurality of concave micro parts will be referred to as "micro-concave parts") 31b may be formed on the exit plane 271b. In FIG. 27, "h" denotes the combined depth of the multiple micro-concave parts 31b and the catalyst layer 274, and "P" denotes the pitches of the combination of the multiple micro-concave parts 31b and the catalyst layer 274. The multiple micro-concave parts 31b is obtained by etching a plurality of portions of one side of the window 27C-1 to form the multiple micro-concave parts 31b. Also in the configuration according to the first modification, advantageous effects similar to those of the embodiments of the present disclosure as described above can be achieved.

Figure 28:
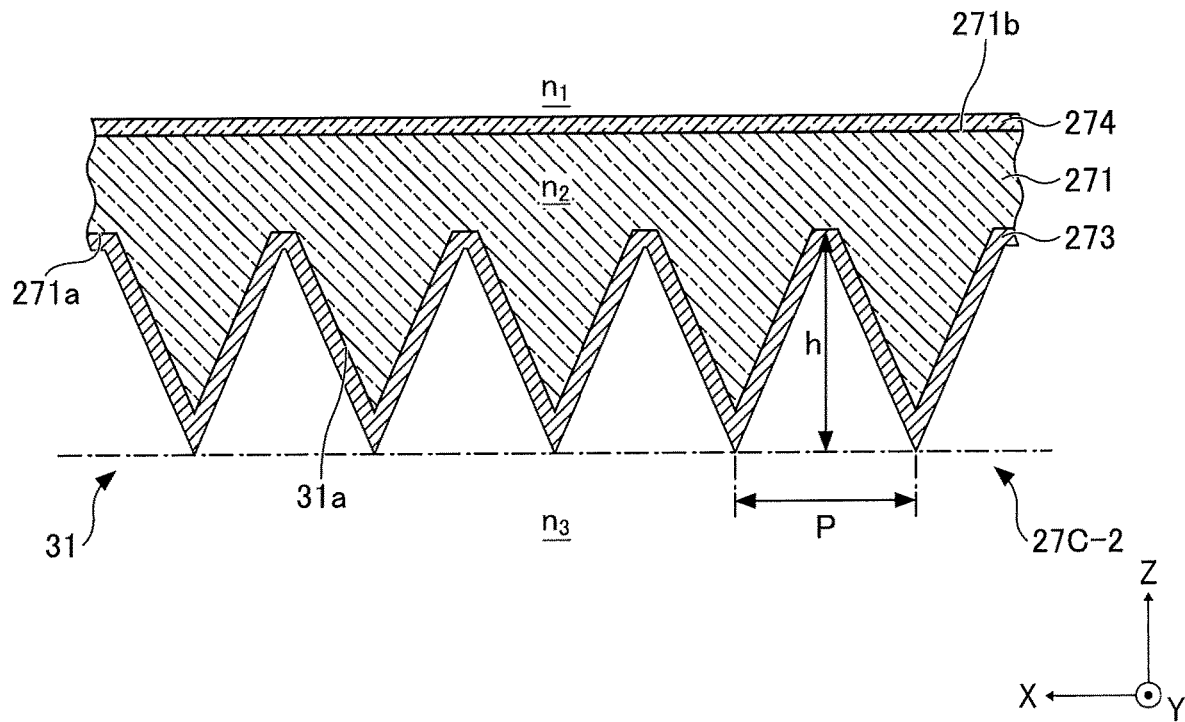
FIG. 28 is a diagram illustrating a second modification of a window according to an embodiment of the present invention.

FIG. 28 is a diagram illustrating a second modification of the window according to the above embodiments of the present disclosure.

A window 27C-2 according to the second modification is illustrated in FIG. 28, and the microstructure division 31 may be formed on the optical input end (i.e., the surface on the incident side). In FIG. 28, "h" and "P" denote the depths and pitches of the microstructure division 31, respectively. In the second modification of the embodiments of the present disclosure, the changes in refractive index on the interface between the atmosphere inside the housing 28 and the optical input end of the window 27C-2 can be made even gentler than "$n_3 \rightarrow n_2$" ($n_3 \rightarrow n_i$ ($>n_2$)). Accordingly, the reflection of the laser beams on the optical input end can be controlled, and the laser beams can be prevented from returning to the laser medium 251 or the surface-emitting laser 21. As a result, variations in intensity of the laser beams can be prevented or reduced.

Figure 29:
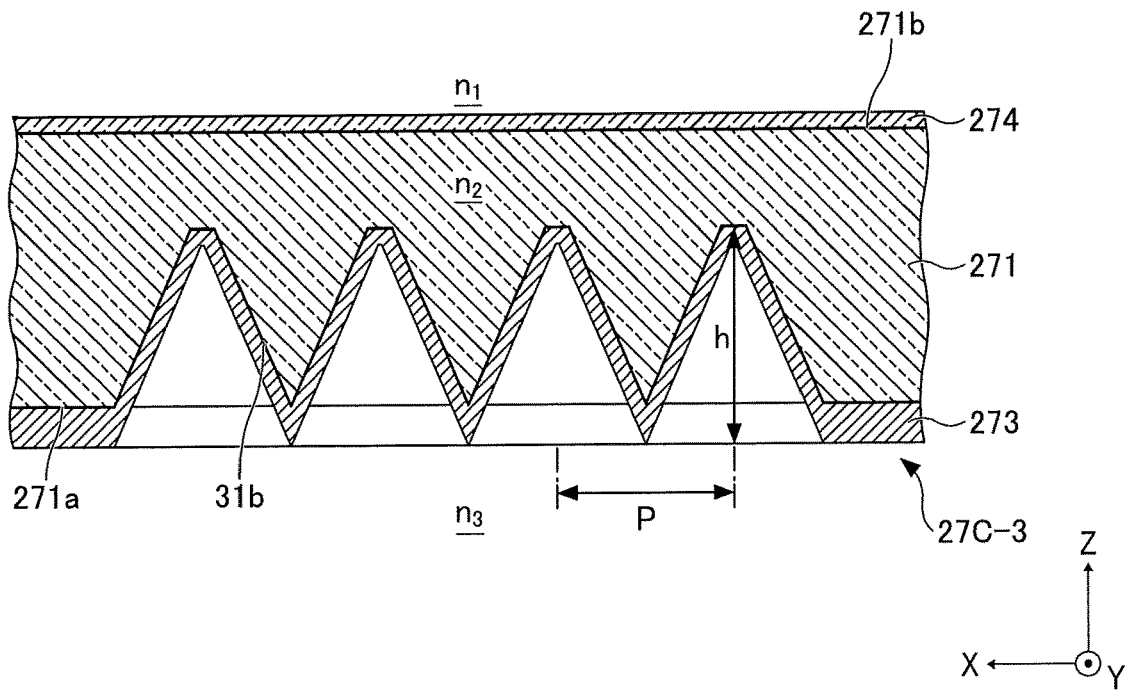
FIG. 29 is a diagram illustrating a third modification of a window according to an embodiment of the present invention.

FIG. 29 is a diagram illustrating a third modification of the window according to the above embodiments of the present disclosure.

A window 27C-3 according to the third modification is illustrated in FIG. 29, and multiple micro-concave parts 31b may be formed on the optical input end. In FIG. 29, "h" and "P" denote the depths and pitches of the multiple micro-concave parts 31b, respectively. More specifically, the multiple micro-concave parts 31b may be formed by etching a plurality of portions of one side of the optical window 271. Also in the third modification of the embodiments of the present disclosure, the changes in refractive index on the interface between the atmosphere inside the housing 28 and the optical input end of the optical window 271 can be made gentler than "$n_3$->$n_2$" ($n_3$->$n_i$ (>$n_2$)). Accordingly, the reflection of the laser beams on the optical input end can be controlled, and thus the laser beams can be prevented from returning to the laser medium 251 or the surface-emitting laser 21. As a result, variations in intensity of the laser beams can be prevented or reduced.

Figure 30:
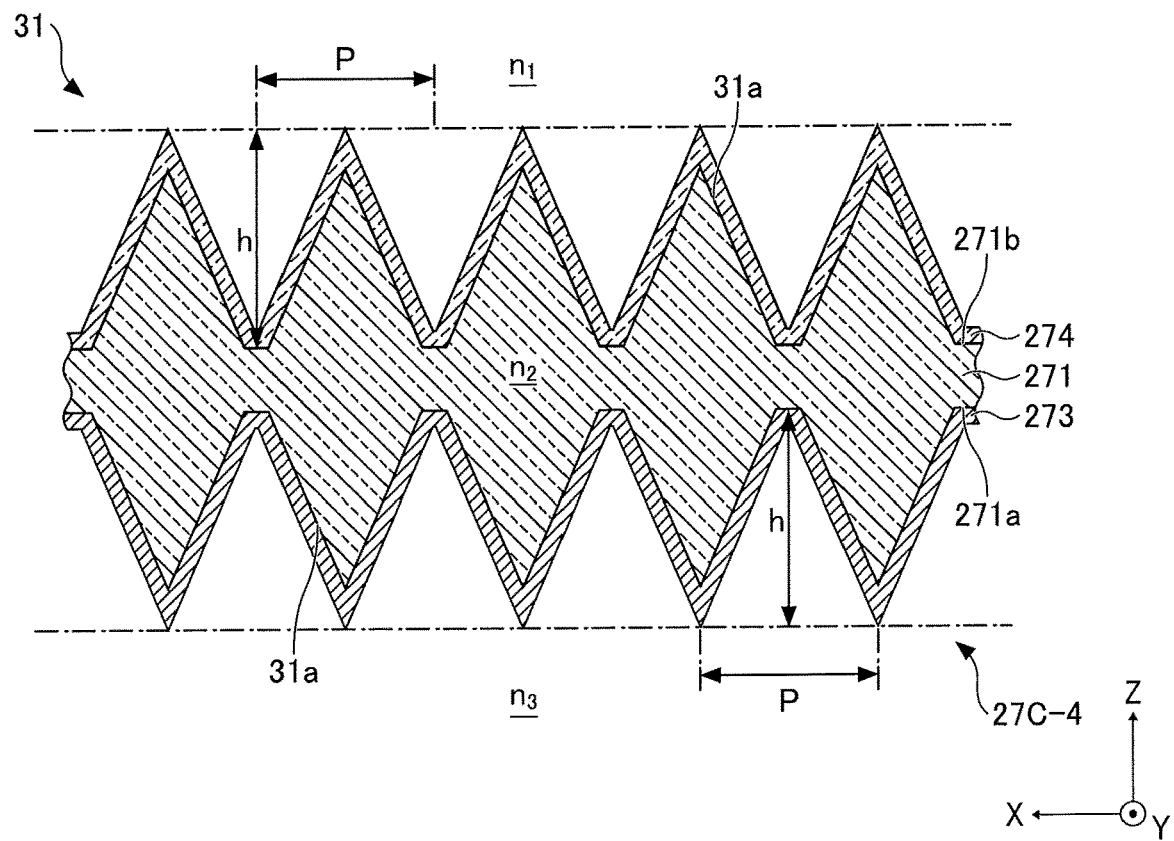
FIG. 30 is a diagram illustrating a fourth modification of a window according to an embodiment of the present invention.

FIG. 30 is a diagram illustrating a fourth modification of the window according to the above embodiments of the present disclosure.

A window 27C-4 according to the fourth modification is illustrated in FIG. 30, and like the window 27C-4, the multiple micro-convex parts 31a may be formed on the exit plane 271b and the optical input end. On the exit plane 271b side of FIG. 30, "h" denotes the combined depth of the multiple micro-concave parts 31b and the catalyst layer 274, and "P" denotes the pitches of the combination of the multiple micro-concave parts 31b and the catalyst layer 274. On the optical input end side, the multiple micro-concave parts 31b may be formed with the depth "h" and the pitch "P."

In the fourth modification, the reflection of the laser beams on the exit plane 271b and the optical input end can be controlled. Due to this configuration, the window can be prevented from degrading, and the laser beams can be prevented from returning to the laser medium 251 or to the surface-emitting laser 21. Accordingly, variations in intensity of the laser beams can further be prevented or reduced.

Figure 31:
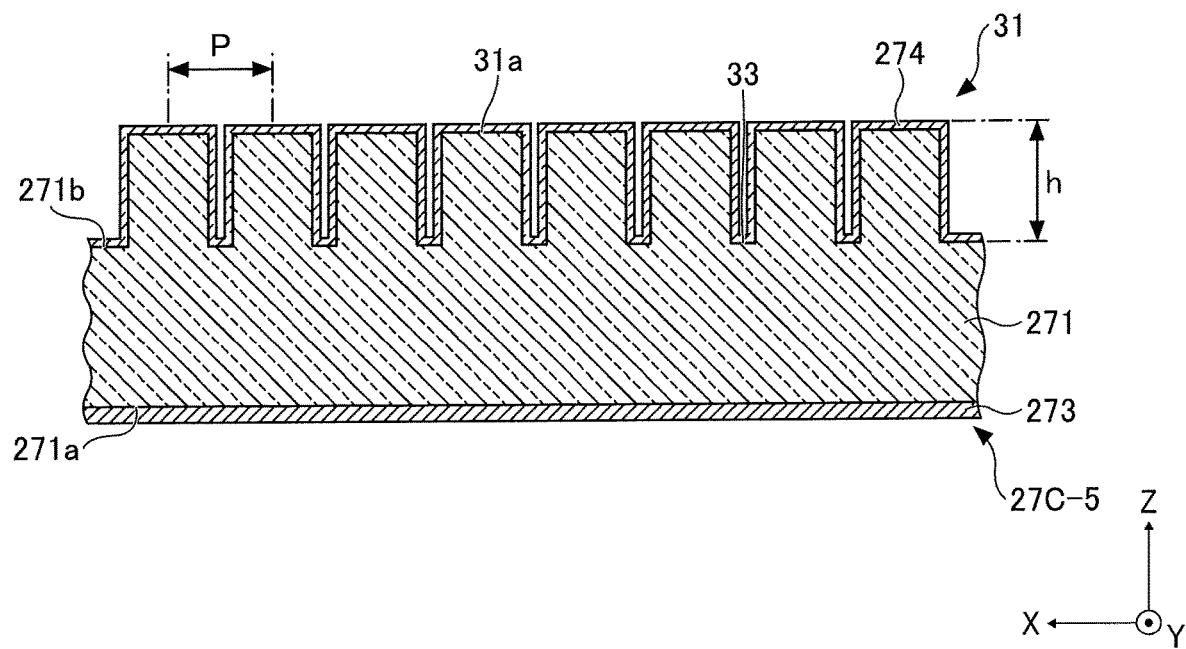
FIG. 31 is a diagram illustrating a fifth modification of a window according to an embodiment of the present invention.

FIG. 31 is a diagram illustrating a fifth modification of the window according to the above embodiments of the present disclosure.

A window 27C-5 according to the fifth modification is illustrated in FIG. 31, and like the window 27C-5, the shape of the micro-convex parts 31a may be columnar. Also in this configuration, the laser beams to be reflected can be reduced compared with the known configurations. Accordingly, both improvement in heat resistance and reduction in laser beams to be reflected can be achieved. Note also that the cylindrical micro-convex parts 31a may be, for example, cylindrical, elliptically cylindrical, quadrangularly cylindrical, polygonally cylindrical.

Figure 32:
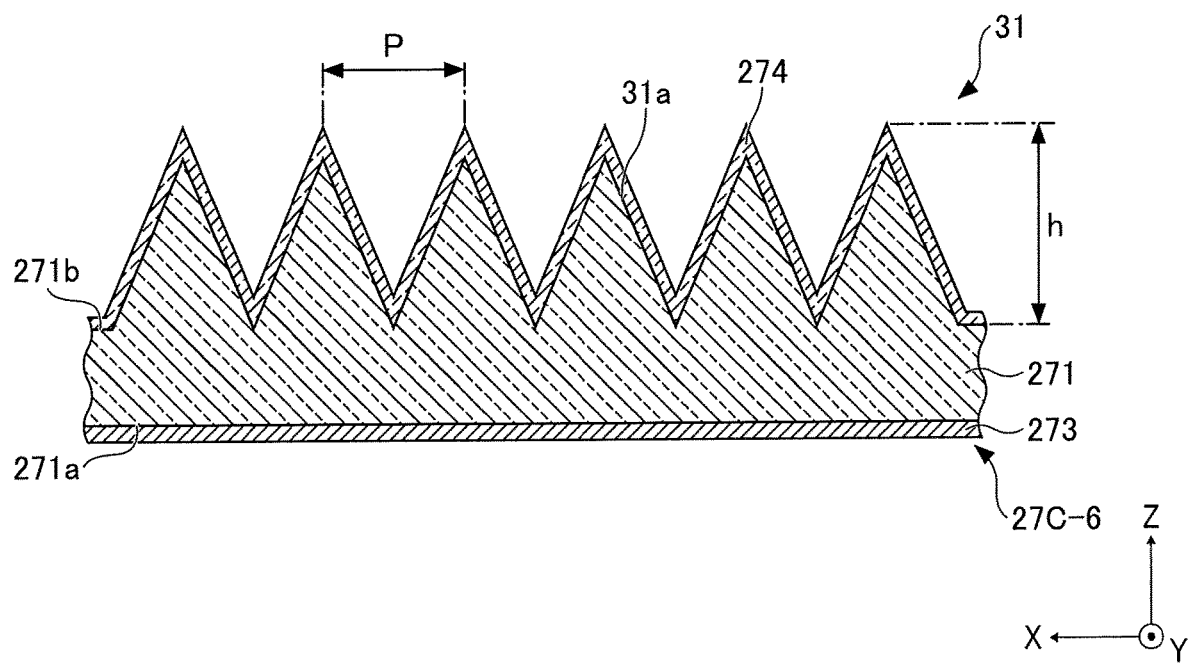
FIG. 32 is a diagram illustrating a sixth modification of a window according to an embodiment of the present invention.

FIG. 32 is a diagram illustrating a sixth modification of the window according to the above embodiments of the present disclosure.

A window 27C-6 according to the sixth modification is illustrated in FIG. 32, and like the window 27C-6, the gap between a neighboring pair of the micro-convex parts 31a may substantially be zero. In other words, the flat surfaces 33 as in the above embodiments of the present disclosure may be omitted. Also in this configuration, the laser beams to be reflected can be reduced compared with the known configurations. As a result, both improvement in heat resistance and reduction in laser beams to be reflected can be achieved.

In the first to sixth modifications of the above embodiments of the present disclosure, the area of the exit plane 271b where a micro-convex structure and a micro-concave structure are formed may be configured in a similar manner to the first area to fifth area of the microstructure division as described above.

In the fourth modification as described above, the concave parts or the convex parts of the micro-convex structure and the micro-concave structure are in line with each other. However, no limitation is indicated thereby, and the concave parts or the convex parts of the micro-convex structure and the micro-concave structure may be misaligned or displaced from each other.

Note also that the area of the microstructure division is not limited to a circular shape, and may be in other shapes such as an ellipse and a polygon.

In the above embodiments of the present disclosure, a micro-convex structure and a micro-concave structure are formed on the window 27C. However, no limitation is intended thereby, and a micro-convex structure and a micro-concave structure may be formed on the catalyst layer 274.

In the above embodiments of the present disclosure, the catalyst layer 274 is formed on the surfaces of the microstructure division 31. However, no limitation is intended thereby, and the hydrophilic layer 275, which is described as above with reference to FIG. 9 in the second embodiment, may be formed between the microstructure division 31 and the catalyst layer 274.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A laser device, comprising:
   a light source configured to emit a laser beam;
   an optical system configured to concentrate the laser beam emitted from the light source;
   an optical window through which the laser beam exited from the optical system passes;
   a housing configured to accommodate the optical system; and
   an optical window holding member fixed to the housing, the optical window holding member holding the optical window,
   wherein the optical window has a protruding face through which the laser beam passes, and the protruding face protrudes with reference to an edge of the optical window holding member and a film is formed on the protruding face of the optical window,
   wherein the film is an antireflection film configured to prevent the laser beam from being reflected.

2. A laser device, comprising:
   a light source configured to emit a laser beam;
   an optical system configured to concentrate the laser beam emitted from the light source;
   an optical window through which the laser beam exited from the optical system passes;
   a housing configured to accommodate the optical system; and
   an optical window holding member fixed to the housing, the optical window holding member holding the optical window,
   wherein the optical window has a face through which the laser beam passes, the face is on a same plane with an edge of the optical window holding member, the edge contacts the optical window, and a film is formed on the face of the optical window.

3. The laser device according to claim 2, wherein the film is an antireflection film configured to prevent the laser beam from being reflected.

4. The laser device according to claim 3, wherein the antireflection film has surface roughness (Ra) equal to or less than 100 nm.

5. The laser device according to claim 2, wherein the film is a catalyst layer configured to enhance oxidation-reduction reaction.

6. The laser device according to claim 5, wherein the film has thickness equal to or less than 1 μm.

7. The laser device according to claim 6, wherein the catalyst layer includes a photocatalyst, and the photocatalyst has an average particle diameter equal to or shorter than 100 nm.

8. The laser device according to claim 6, further comprising a hydrophilic layer between the optical window and the catalyst layer.

9. The laser device according to claim 2, wherein the optical window has a microstructure division provided with a plurality of micro-convex parts or micro-concave parts, on at least one face through which the laser beam passes.

10. The laser device according to claim 9, wherein the optical window holding member and the housing are formed of an iron-nickel-cobalt alloy.

11. The laser device according to claim 2, wherein the optical window holding member and the housing are formed of a material having a same coefficient of thermal expansion.

12. A laser device comprising:
a light source configured to emit a laser beam;
an optical system configured to concentrate the laser beam emitted from the light source;
an optical window through which the laser beam exited from the optical system passes;
a housing configured to accommodate the optical system; and
an optical window holding member fixed to the housing, the optical window holding member holding the optical window,
wherein the optical window has a depressed face through which the laser beam passes and the depressed face is depressed with reference to an edge of the optical window holding member,
the optical window holding member has a diameter-enlarged portion whose internal diameter is enlarged from a depressed position of the depressed face of the optical window towards an outside of the optical window holding member, and
a film is formed on the depressed face that is at the depressed position.

13. The laser device according to claim 12, wherein the film is formed across the optical window and the optical window holding member.

14. The laser device according to claim 12, wherein the film is an antireflection film configured to prevent the laser beam from being reflected.

15. The laser device according to claim 14, wherein the antireflection film has surface roughness (Ra) equal to or less than 100 nm.

16. The laser device according to claim 12, wherein the film is a catalyst layer configured to enhance oxidation-reduction reaction.

17. The laser device according to claim 16, wherein the film has thickness equal to or less than 1 μm.

18. The laser device according to claim 17, wherein the catalyst layer includes a photocatalyst, and the photocatalyst has an average particle diameter equal to or shorter than 100 nm.

19. The laser device according to claim 17, further comprising a hydrophilic layer between the optical window and the catalyst layer.

20. An internal combustion engine comprising:
the laser device according to claim 1; and
a combustion chamber configured to bum fuel,
wherein the fuel is ignited by the laser beam emitted from laser device.

* * * * *